United States Patent
Kim et al.

(10) Patent No.: US 8,476,666 B2
(45) Date of Patent: Jul. 2, 2013

(54) LIGHT EMITTING ELEMENTS, LIGHT EMITTING DEVICES INCLUDING LIGHT EMITTING ELEMENTS AND METHODS OF MANUFACTURING SUCH LIGHT EMITTING ELEMENTS AND/OR DEVICES

(75) Inventors: Yu-Sik Kim, Anyang-si (KR); Seung-Jae Lee, Chunan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 924 days.

(21) Appl. No.: 12/457,177

(22) Filed: Jun. 3, 2009

(65) Prior Publication Data
US 2009/0315054 A1 Dec. 24, 2009

(30) Foreign Application Priority Data
Jun. 24, 2008 (KR) .................. 10-2008-0059569

(51) Int. Cl.
*H01L 33/00* (2010.01)
(52) U.S. Cl.
USPC ............................................ 257/99; 257/773

(58) Field of Classification Search
USPC ....................................... 257/94, 98, 99, 773
See application file for complete search history.

(56) References Cited

U.S. PATENT DOCUMENTS

| | | | | |
|---|---|---|---|---|
| 4,864,370 | A | * | 9/1989 | Gaw et al. ................. 257/94 |
| 8,258,539 | B2 | * | 9/2012 | Hwang et al. ............. 257/99 |

FOREIGN PATENT DOCUMENTS

| | | |
|---|---|---|
| EP | 1 677 366 A2 | 7/2006 |
| JP | 2000-101194 A | 4/2000 |
| KR | 10-0487757 B1 | 4/2005 |
| KR | 10-0604562 B1 | 7/2006 |

OTHER PUBLICATIONS

Chinese Office Action Dated Dec. 3, 2012.

* cited by examiner

*Primary Examiner* — Mark Prenty
(74) *Attorney, Agent, or Firm* — Lee & Morse, P.C.

(57) ABSTRACT

An emitting device including a first electrode, a second electrode spaced apart from the first electrode, an emitting pattern including a portion between the first electrode and the second electrode, and a block pattern including a portion between the emitting pattern and the first electrode and/or on a same level as the first electrode.

39 Claims, 21 Drawing Sheets

LIGHT EMITTING ELEMENTS, LIGHT EMITTING DEVICES INCLUDING LIGHT EMITTING ELEMENTS AND METHODS OF MANUFACTURING SUCH LIGHT EMITTING ELEMENTS AND/OR DEVICES

BACKGROUND

1. Field

Embodiments relate to light emitting elements, light emitting devices including such light emitting elements, and methods of manufacturing such light emitting elements and/or devices. More particularly, embodiments relate to light emitting elements and light emitting devices employing a current block pattern and having improved light efficiency as compared to conventional elements and/or devices. Embodiments also relate to methods of manufacturing such light emitting elements and/or devices.

2. Description of the Related Art

Light emitting elements, e.g., light emitting diodes (LEDs), are employed in a variety of applications, e.g., displays, digital clocks, remote controls, watches, calculators, cell phones, indicator lights, backlights, etc.

LEDs generally emit light as a result of electroluminescence, i.e., recombination of electron-hole pairs. Electron-hole pairs may be recombined as a result of electric current at a semiconductor p-n junction. When electrons and holes recombine, energy may be given off in the form of photons. In organic light emitting diodes (OLEDs), e.g., energy may be released in the form of photons when an electric current flows from a cathode to an anode through organic layers, e.g., emissive layer and conductive layer.

While LEDs are already being used in a wide variety of applications, there is a need for light emitting elements, such as LEDs, having improved light efficiency.

SUMMARY

Embodiments are therefore directed to light emitting elements, light emitting devices employing such light emitting elements and methods of fabricating such light emitting elements and/or devices, which substantially overcome one or more of the problems due to the limitations and disadvantages of the related art.

It is therefore a feature of an embodiment to provide a light emitting device using a current block pattern to increase light efficiency as compared to conventional devices.

It is therefore a separate feature of an embodiment to provide a light emitting apparatus including a light emitting device using a current block pattern to increase light efficiency as compared to conventional devices.

It is therefore a separate feature of an embodiment to provide a method of forming light emitting devices having increased light efficiency as compared to conventional devices.

It is therefore a separate feature of an embodiment to provide a light emitting device including a block pattern adapted to disperse current throughout an emitting pattern of a light emitting region of the light emitting device.

It is therefore a separate feature of an embodiment to provide a light emitting device including a current dispersing mechanism arranged along a path of current flow between one electrode and another electrode of the light emitting device so as to disperse all current flowing from one electrode to the other and throughout an emitting pattern associated therewith.

At least one of the above and other features and advantages of embodiments may be separately realized by providing an emitting device, comprising a first electrode, a second electrode spaced apart from the first electrode, an emitting pattern including a portion between the first electrode and the second electrode, and a block pattern including a portion between the emitting pattern and the first electrode and/or on a same level as the first electrode.

The first electrode may include a first portion extending substantially along a first direction and a second portion extending substantially along a second direction, the first direction crossing the second direction.

The first electrode may include two protruding portions defining a cavity and an upper portion of the cavity may be wider than a lower portion of the cavity.

The first electrode may include a plurality of protrusions defining a light emitting region and a non-light emitting region, and the second electrode may overlap the non-light emitting region of the emitting device.

The block pattern may include an insulating material.

The block pattern may include an oxide layer, a nitride layer, an oxide-nitride layer, an aluminum-oxide layer and/or an aluminum-nitride layer.

At least a portion of the block pattern may be directly on the first electrode.

The first electrode may be substantially or completely flat.

The block pattern may include a first block pattern and a second block pattern.

The first block pattern and the second block pattern may each one of a line pattern, a mesh pattern and a dot pattern.

The first block pattern and the second block pattern may be arranged offset relative to each other such that at least a portion of the first block pattern overlaps a space defined by the second block pattern and a portion of the second block pattern overlaps a space defined by the first block pattern.

A pattern of the first block pattern may be complementary to a pattern of the second block pattern.

At least a portion of the first block pattern may be between the emitting pattern and the first electrode and/or on a same level as the first electrode and at least a portion of the second block pattern may be between the emitting pattern and the second electrode and/or on a same level as the second electrode.

The device may include a first conductive pattern below the emitting pattern and a second conductive pattern above the emitting pattern.

The first conductive pattern, the emitting pattern and/or the second conductive pattern may each include $In_xAl_yGa_{(1-x-y)}N$, where $0 \leq x \leq 1$ and $0 \leq y \leq 1$.

The first electrode may be arranged such that a portion of the first conductive pattern is at a level higher than a level of the first electrode and another portion of the first conductive pattern may be at a level lower than the level of the first electrode.

At least one portion of the first electrode may be on a same level as a respective portion of the emitting pattern and/or the block pattern.

At least a portion of the block pattern may be aligned with and/or embedded within a portion of the second conductive pattern.

At least a portion of the block pattern may be aligned with and/or embedded within a portion of the first conductive pattern.

The device may further include an ohmic pattern arranged between at least one of the first electrode and the emitting pattern and/or the second electrode and the emitting pattern.

The ohmic pattern may include a pattern that is complementary to at least a portion of the block pattern and may be arranged on a same level as the complementary portion of the block pattern.

The ohmic pattern may include a first ohmic pattern between the first electrode and the emitting pattern and a second ohmic pattern between the emitting pattern and the second electrode.

The block pattern may include a protrusion.

The device may further include a buffer layer between the second electrode and the block pattern.

The buffer layer may include $In_xAl_yG_{(1-x-y)}$ and/or $Si_xC_yN_{(1-x-y)}$, where $0 \leq x \leq 1$ and $0 \leq y \leq 1$.

The first electrode may include a reflective material.

A light emitting apparatus may include the light emitting device, a first conductive region on a base substrate electrically connected to the first electrode, and a second conductive region on the base substrate electrically connected to the second electrode.

The light emitting apparatus may be a liquid crystal display back light unit, a projector or a lamp.

The first electrode may be electrically connected to the first conductive region through a conductive substrate on which the first electrode is arranged, and the second electrode may be electrically connected to the second conductive region with a wire.

The first electrode and the second electrode may be electrically connected to the first conductive region and the second conductive region, respectively, with a conductive resin.

The first conductive region and the second conductive region may be on a first side of the base substrate, and the light emitting apparatus may further include a third conductive region on a second side of the base substrate, a fourth conductive region on the second side of the base substrate, at least one via connecting the first conductive region to the third conductive region, and at least one via connecting the second conductive region to the fourth conductive region.

The device may include a phosphor layer on the light emitting device.

The phosphor layer may include a transparent resin, wherein phosphor may be dispersed within the transparent resin, on the transparent resin and/or between the transparent resin and the light emitting device.

The light emitting apparatus may include a plurality of the light emitting devices, and the phosphor layer may be arranged in a line-type and/or dot-type manner on the light emitting devices.

At least one of the above and other features and advantages embodiments may be separately realized by providing an emitting device, including a first electrode on a conductive substrate, a second electrode on the first electrode, an emitting pattern including a portion between the first electrode and the second electrode, and current regulating mechanism adapted to regulate current flow through the emitting pattern, wherein at least a portion of the current regulating mechanism is arranged along a current path between the first electrode and the emitting pattern such that all current flowing from the first electrode to the emitting pattern passes through at least a portion of the current regulating mechanism before reaching the emitting pattern.

The current regulating mechanism may include a first regulating pattern arranged between the first electrode and the emitting pattern and/or on a same level as the first electrode.

The current regulating mechanism may include an insulator.

The device may further include a conductive pattern on the emitting pattern and buffering mechanism adapted to protect the current regulating mechanism and/or to seed a conductive pattern on the emitting pattern.

At least one of the above and other features and advantages of embodiments may be separately realized by providing a method of fabricating an emitting device, the method including forming a block pattern on a substrate, forming a conductive pattern on the substrate, forming an emitting pattern on the substrate, forming another conductive pattern on the substrate, forming a first electrode substantially and/or completely on a first side of the emitting pattern, and forming a second electrode substantially and/or completely on a second side of the emitting pattern, the first side being different from the second side of the emitting pattern, wherein the block pattern includes a portion between the emitting pattern and the first electrode and/or on a same level as the first electrode.

The method may include forming another block pattern on the substrate, wherein the another block pattern includes a portion between the emitting pattern and the second electrode and/or on a same level as the second electrode.

Forming the conductive pattern may at least partially occur before forming the block pattern and the block pattern is formed on at least a portion of the conductive pattern on the substrate.

The method may include forming a buffer layer on at least one of the another block pattern and the another conductive pattern, and forming an ohmic layer on the buffer layer, wherein forming the second electrode may include forming the second electrode on the ohmic layer.

Forming the another block pattern may occur before forming the another conductive pattern and forming the block pattern, the another conductive pattern may be formed on the another block pattern and the block pattern may be formed on the emitting pattern and the another conductive pattern.

The substrate may be a temporary substrate and the method may further include connecting, electrically, the first electrode to a conductive substrate and removing the temporary substrate, and wherein forming the second electrode may occur after removing the temporary substrate and may include forming the second electrode on the another conductive pattern, the second electrode may be formed on a side of the another conductive pattern that faced the temporary substrate before it was removed.

The method may include successively forming a sacrificial layer and a buffer layer on the temporary substrate before forming the another block pattern, and after removing the temporary substrate and the sacrificial layer, forming an ohmic layer on the buffer layer and forming the second electrode on the another ohmic layer.

Forming the another conductive pattern, forming the emitting pattern and forming the conductive pattern may include successively forming an another conductive layer, an emitting layer and a conductive layer on the another block pattern, and selectively etching the conductive layer, the emitting layer and the another conductive layer to respectively form the conductive pattern, the emitting pattern and the another conductive, wherein the conductive pattern, the emitting pattern and the another conductive pattern may form an emitting structure of an intermediate structure.

Forming the block pattern may include forming a block layer on exposed portions of the emitting structure and selectively patterning the block layer to form the block pattern to expose portions of the conductive pattern and the method may further include forming an ohmic pattern at least on exposed portions of the conductive pattern.

Forming the emitting structure may include removing respective portions of the conductive layer, the another conductive layer and the emitting layer to form trenches in the intermediate structure.

Forming the block pattern and forming the another block pattern may include forming and patterning a blocking insulating layer and another blocking insulating layer, respectively, in a line-type, dot-type and/or mesh-type manner.

BRIEF DESCRIPTION OF THE DRAWINGS

The above and other features and advantages of embodiments will become more apparent to those of ordinary skill in the art by describing in detail exemplary embodiments with reference to the attached drawings, in which.

DETAILED DESCRIPTION

Figure 1:
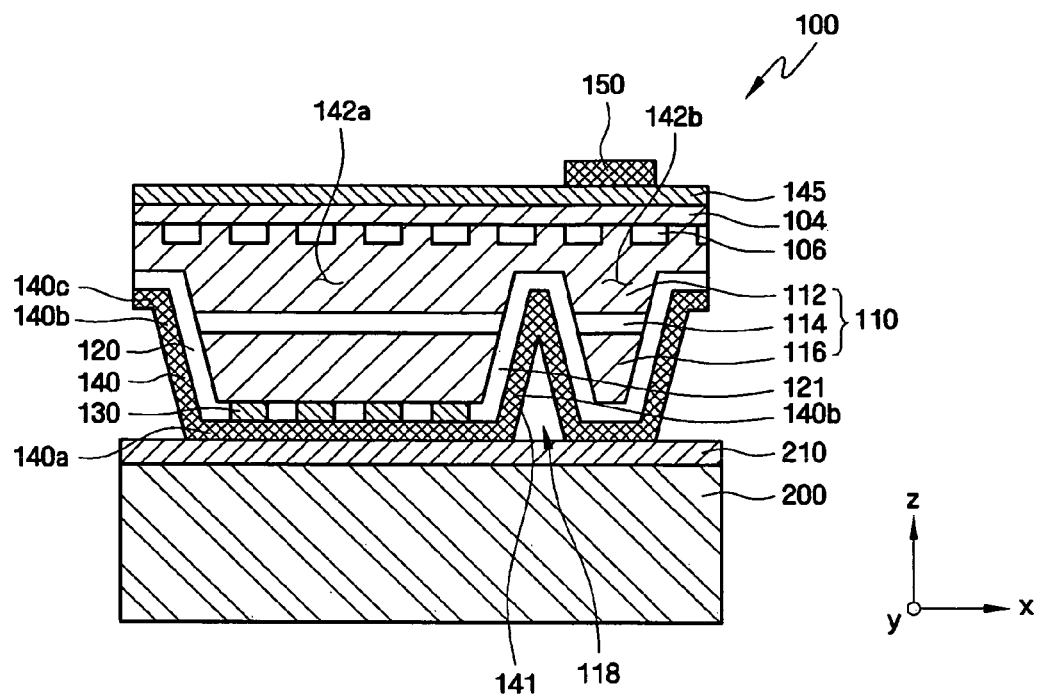
FIG. 1 illustrates a cross-sectional view of a light emitting device according to a first exemplary embodiment employing one or more aspects of the invention.

Korean Patent Application No. 1-2008-0059569, filed on Jun. 24, 2008, in the Korean Intellectual Property Office, and entitled: "LIGHT EMITTING ELEMENT, LIGHT EMITTING DEVICE COMPRISING THE SAME, AND FABRICATING METHOD OF THE LIGHT EMITTING ELEMENT AND LIGHT EMITTING DEVICE," is incorporated by reference herein in its entirety.

Embodiments of one or more aspects of the invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of aspects of the invention to those skilled in the art.

In the figures, the dimensions of layers and regions may be exaggerated for clarity of illustration. It will also be understood that when an element is referred to as being "on" another element, it may be directly on the other element, or intervening elements may also be present. Further, it will be understood that when an element is referred to as being "under" another element, it may be directly under, and one or more intervening element may also be present. In addition, it will also be understood that when an element is referred to as being "between" two elements, it may be the only element between the two elements, or one or more intervening elements may also be present. Additionally, it will be understood, e.g., that when an element is referred to as being "between" two elements, it may be physically arranged between facing/overlapping portions of the two elements and/or it may be physically arranged such that one of the two elements is at a level below a level of the element and the other of the two elements is at a level above the level at which the element is arranged. It will also be understood that, although the terms "first" and "second" etc. may be used herein to describe various elements, these elements should not be limited by these terms. These terms are only used to distinguish one element from another element. Thus, a first element discussed below could be termed, e.g., a second element without departing from the teachings of exemplary embodiments. Like reference numerals refer to like elements throughout the specification.

Figure 2A:
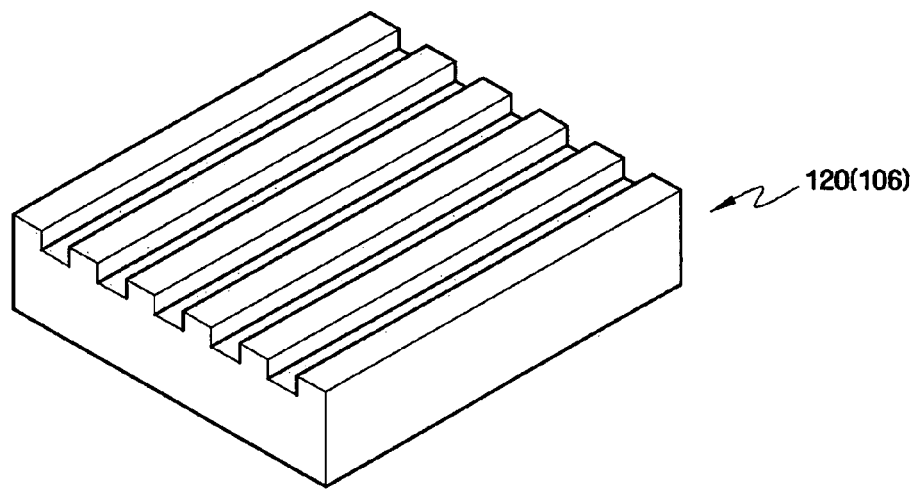
FIGS. 2A, 2B and 2C illustrate top-side views of exemplary embodiments of a block pattern employable in the light emitting device of FIG. 1.
Figure 2B:
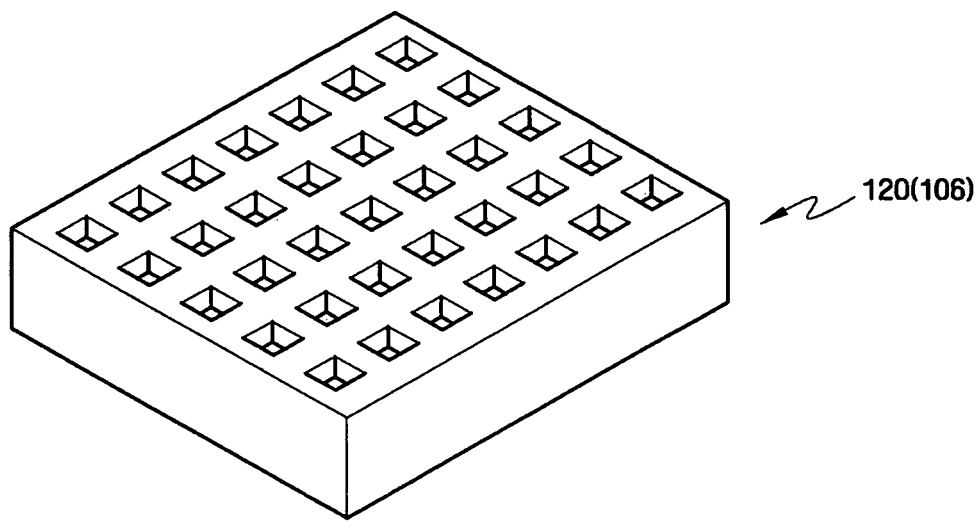
Figure 2C:
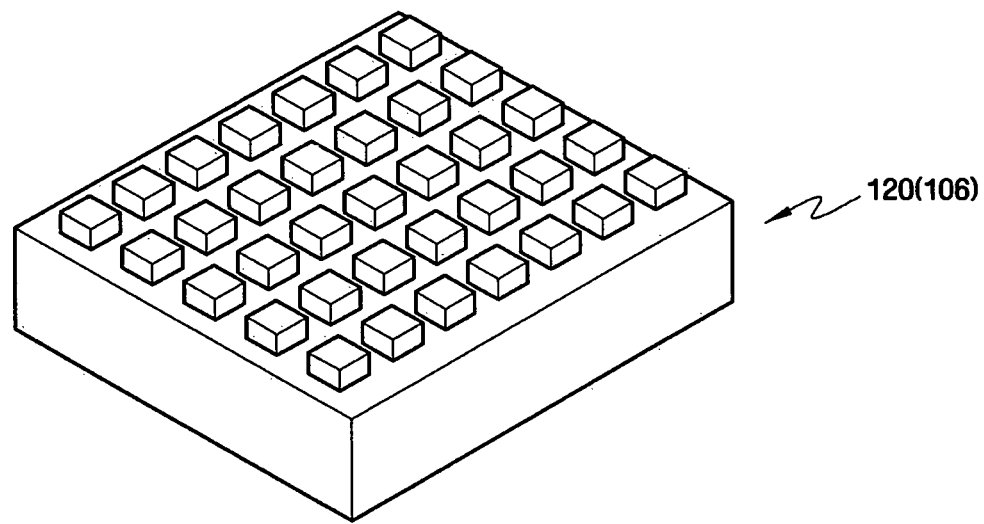
Figure 3A:
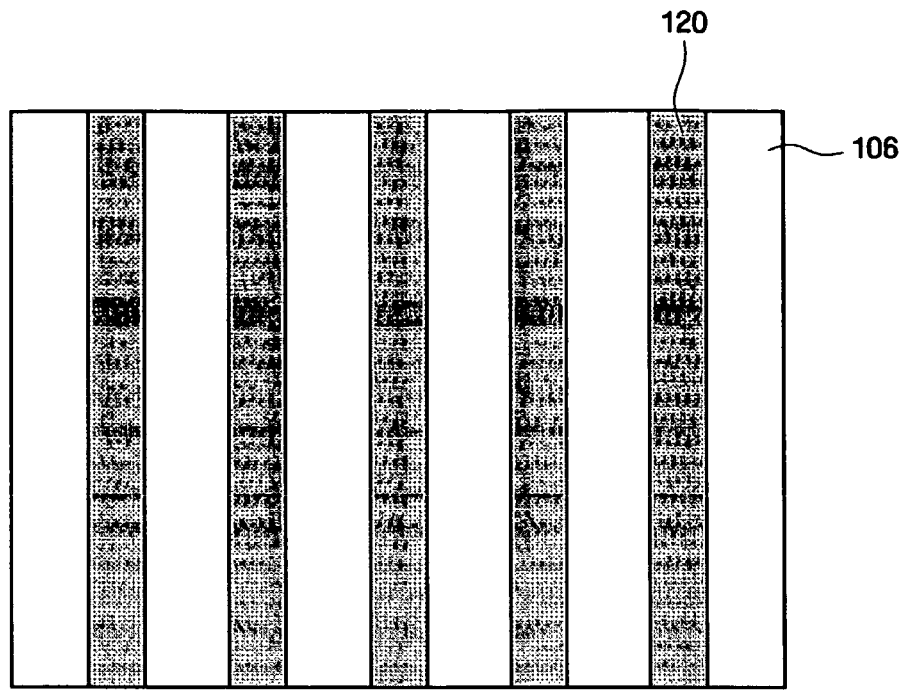
FIGS. 3A and 3B illustrate top-down views of exemplary arrangements of block patterns in the light emitting device of FIG. 1.
Figure 3B:
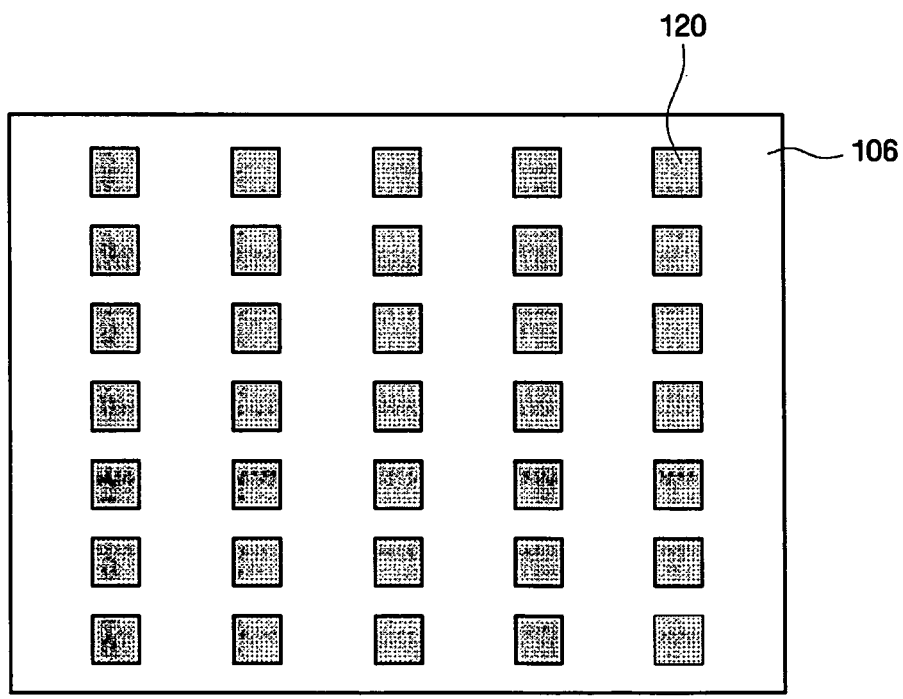

FIG. 1 illustrates a cross-sectional view of a first exemplary embodiment of a light emitting device 100 employing one or more aspects of the invention. FIGS. 2A, 2B and 2C illustrate top-side views of exemplary embodiments of block patterns 120, 106 employable in the light emitting device 100 of FIG. 1. FIGS. 3A and 3B illustrate top-down views of exemplary arrangements of the exemplary block patterns 120, 106 in the light emitting device 100 of FIG. 1.

Referring to FIG. 1, the light emitting device 100 may include an emitting structure 110, a first electrode 140, a second electrode 150, a first block pattern 120, a second block pattern 106, a first ohmic layer 130, a second ohmic layer 145, a buffer layer 104, a conductive substrate 200 and an intermediate layer 210. The emitting structure 110 may include a first conductive pattern 112, an emitting pattern 114, and a second conductive pattern 116.

More particularly, the intermediate layer 210 may be on the conductive substrate 200. The conductive substrate 200 may include, e.g., Si, strained Si, Si alloy, silicon-on-insulator (SOI), SiC, SiGe, SiGeC, Ge, Ge alloy, GaAs, InAs, III-V compound semiconductor, II-VI compound semiconductor, etc. The intermediate layer 210 may bond the first electrode 140 to the conductive substrate 200. The intermediate layer 210 may include, e.g., Au, Ag, Pt, Ni, Cu, Sn, Al, Pb, Cr, Ti, W, etc.

The first electrode 140 may be on the intermediate layer 210. The first electrode 140 may include, e.g., a reflective material such that at least some of the light generated at the emitting pattern 114 and emitted onto the first electrode 140 may be reflected away from the first electrode 140. For example, the first electrode 140 may be a metal and may include Ag, Al, etc.

In some embodiments, e.g., the first electrode 140 may include a bottom portion 140*a* that conforms to a shape of the intermediate layer 210 and/or the conductive substrate 200, e.g., extends substantially along a plane, e.g., x-y plane, parallel to the intermediate layer 210, and one or more side portions 140*b*. The side portion(s) 140*b* may extend along a direction(s) that crosses the plane along which the bottom portion 140*a* of the first electrode 140 extends. More particularly, e.g., referring to FIG. 1, the side portions 140*b* of the first electrode 140 may generally extend at an angle of greater than 90° relative to the bottom portion 140*a* such that a distance between facing lower portions, e.g., portions that are relatively closer to the conductive substrate 200, of the respective side portions 140*b* is less than a distance between facing upper portions, e.g., portions that are relatively further away from the conductive substrate 200, of the respective side portions 140*b*.

Adjacent or corresponding ones of the side portions 140*b* may together define protrusion(s) 141 in the first electrode 140 of the light emitting device 100. In some embodiments, the first electrode 140 may include at least one protrusion 141 defining a groove 118 between the first electrode 140 and the conductive substrate 200. The exemplary light emitting device 100 of FIG. 1 illustrates an embodiment with a single protrusion 141. In some embodiments, e.g., the protrusion(s) 141 and/or the side portion(s) 140*b* of the first electrode 140 may define one or more cavities 142*a*, 142*b*. More particularly, e.g., the first electrode 140 may define one or more cavities 142*a* corresponding to a light emitting region of the light emitting device 100 and one or more other cavities 142*b* corresponding to a non-light emitting region of the light emitting device 100.

Embodiments are not limited thereto as, e.g., one, some or all the plurality of regions of the light emitting device 100 resulting from the cavities, e.g., 142*a*, 142*b*, may, e.g., correspond to light emitting of the light emitting device 100. The protrusion(s) 141 may include, e.g., an inverted substantially-U-like or an inverted substantially-V-like shape.

Further, in some embodiments, a portion(s) 140*c* of first electrode 140 may extend above a level of the emitting pattern 114, e.g., a level higher than the level of the emitting pattern 114 relative to a z-direction. That is, e.g., referring to FIG. 1, at least some of the emitting structure 110 may be arranged within the cavity 142*a*, e.g., bowl-shaped cavity, defined by the side portions 140*b*. More particularly, e.g., the emitting pattern 114 and the second conductive pattern 116 may be completely within the cavity 142*a*. In some embodiments, e.g., the portion(s) 140*c* of the first electrode 140 may be embedded into a portion of the first conductive pattern 112. It should be understood that in some embodiments, the first electrode 140 may be completely or substantially flat, i.e., not include any side portion(s) 140*b* or protrusions 141.

The first block pattern 120 may be on, e.g., directly on, the first electrode 140. Referring to FIG. 1, the first block pattern 120 may conform to the first electrode 140. More particularly, in the exemplary embodiment illustrated in FIG. 1, e.g., the first block pattern 120 may include at least one protrusion 121 corresponding to the protrusion(s) 141 of the first electrode 140. Further, referring to FIG. 1, portion(s) of the first block pattern 120 may be at a same and/or higher level as portion(s) of the first electrode 140 relative to a z-direction. At least a portion of the first block pattern 120 may be at a level lower than the emitting pattern 114 and at a same and/or higher level than the first electrode 140. At least a portion of the first block pattern 120 may be between the emitting pattern 114 and the first electrode 140. In the exemplary embodiment illustrated in FIG. 1, the block pattern 120 completely covers side portions 140*b* of the first electrode 140 and partially covers the bottom portion 140*b*, i.e., partially exposes the bottom portion 140*b* of the first electrode 140.

Referring to FIG. 1, the first block pattern 120 may be patterned to expose a one or more portions of the first electrode 140. For example, referring to FIGS. 2A, 2B and 2C, the first block pattern 120 may include a line pattern as shown in FIG. 2A, a mesh pattern as shown in FIG. 2B, a dot pattern as shown in FIG. 2C, etc. In some embodiments, at least a portion of the first block pattern 120 at a level below the emitting pattern 114, e.g. portion overlapping the bottom portion 140*a* of the first electrode 140, may be patterned to expose the first electrode 140. More particularly, e.g., in some embodiments, at least a portion of the first block pattern 120 that extends substantially and/or completely parallel to a plane through which light from the light emitting device 100 is to be emitted, e.g., x-y plane, may be patterned to expose portions of the first electrode 140, and other portions, e.g., 140*b*, 140*c*, of the first electrode may be completely covered by the first block pattern 120.

The first block pattern 120 may include, e.g., an insulating material. For example, the first block pattern 120 may include a nitride layer, an oxide layer and/or, more particularly, an oxide-nitride layer, an aluminum-oxide layer, an aluminum-nitride layer, etc.

Referring to FIGS. 3A and 3B, the first block pattern 120 and the second block pattern 106 may be arranged to be offset relative to each other, e.g., complementary. For example, referring to FIG. 3A, in embodiments in which the first block pattern 120 has a line pattern and the second block pattern 106 has a line pattern, lines of the first block pattern 120 may at least partially and/or completely overlap spaces between lines of the second block pattern 106, and/or lines of the second block pattern 106 may at least partially and/or completely overlap spaces between lines of the first block pattern 120. More particularly, e.g., in embodiments, the first block pattern 120 and the second block pattern 106 may be completely complementary to each other such that a combination of the block patterns associated with the emitting pattern 114, e.g., the first block pattern 120 and the second block pattern 106, completely overlaps the emitting pattern 114.

As another example, referring to FIG. 3B, in embodiments in which the first block pattern 120 has a dot pattern and the second block pattern 106 has a dot pattern, dots of the first block pattern 120 may at least partially and/or completely overlap spaces between dots of the second block pattern 106, and/or dots of the second block pattern 106 may at least partially overlap spaces between dots of the first block pattern 120. It should be understood that embodiments are not limited thereto, e.g., respective pattern(s) of the first block pattern 120 and the second block pattern 106 may have patterns that are not complementary.

The first ohmic layer 130 may electrically connect the first electrode 140 and the emitting structure 110. The first ohmic layer 130 may include, e.g., at least one of ITO (Indium Tin Oxide), Zn, ZnO, Ag, Ti, Al, Au, Ni, $In_2O_3$, $SnO_2$, Cu, W and Pt. The first ohmic layer 130 may at least partially fill openings defined by the pattern(s) of the first block pattern 120. Referring to FIG. 1, the first ohmic layer 130 and the first block pattern 120 may together form a layer, e.g., a continuous layer or pattern, in the light emitting device 100. That is, e.g., in some embodiments, the first ohmic layer 130 may occupy spaces defined by the first block pattern 120.

Referring to FIG. 1, the emitting structure 110 may include the first conductive pattern 112, the emitting pattern 114 and the second conductive pattern 116, which may be successively laminated together. The second conductive pattern 116 may be on the first block pattern 120 and/or the first ohmic pattern 130. The emitting pattern 114 may be on the second conductive pattern 116. The emitting pattern 114 may be at a same and/or higher level than at least portions of the first electrode 140 and at a lower level than the second electrode 150. The first conductive pattern 112 may be on the emitting pattern 114.

As discussed above, in some embodiments, the first electrode 140 may include side portion(s) 140b and/or protrusion(s) 141. In such embodiments, e.g., a bottom portion of the emitting structure 110 may include a shape that corresponds to such side portion(s) 140b and/or protrusion(s) 141. For example, referring to FIG. 1, the side portion(s) 140b and/or the protrusions 141 may extend between respective portions of the emitting structure 110. More particularly, e.g., the protrusion 141 may extend between a portion of the emitting structure 110 within the cavity 142a and another portion of the emitting structure 110 within the cavity 142b. Referring to FIG. 1, the protrusion 141 may extend above a level of the second conductive pattern 116 and the emitting pattern 114, and may extend only partially into the first conductive pattern 112, i.e., to a level below an upper surface of the first conductive pattern 112.

Each of the first conductive pattern 112, the emitting pattern 114 and/or the second conductive pattern 116 may include $In_xAl_yGa_{(1-x-y)}N$, where $0 \leq x \leq 1$ and $0 \leq y \leq 1$. More particularly, e.g., the first conductive pattern 112, the emitting pattern 114 and/or the second conductive pattern 116 may include GaN, e.g., AlGaN, InGaN, etc. In embodiments, the first conductive pattern 112 may be one of n-type or p-type, and the second conductive pattern 116 may be the other of p-type or n-type. The emitting pattern 114 may correspond to a region of the light emitting device 100 that generates light as a result of recombination of carriers of the first and second conductive patterns 112, 116. Further, a surface of the first conductive pattern 112 may be textured to raise light extraction efficiency. Embodiments are not limited thereto as, e.g., in some embodiments, e.g., the emitting structure 110 may include a plurality of organic layers forming an organic electroluminescent structure.

The second block pattern 106 may be on and/or within the first conductive pattern 112. The second block pattern 106 may be at a level higher than the emitting pattern 114 and at a same and/or lower level than the second electrode 150.

The second block pattern 106 may be patterned to expose a part of the first electrode 140. For example, referring to FIGS. 2A, 2B and 2C, the second block pattern 106 may include a line pattern as shown in FIG. 2A, a mesh pattern as shown in FIG. 2B, or a dot pattern as shown in FIG. 2C, etc. The second block pattern 106 may include, e.g., an insulating material. For example, the second block pattern 106 may include a nitride layer, an oxide layer and/or, more particularly, an oxide-nitride layer, an aluminum-oxide layer and/or an aluminum-nitride layer.

More particularly, the first block pattern 120 and the second block pattern 106 may be arranged within a path of current flow between the first electrode 140 and the second electrode 150. That is, e.g., in embodiments, a flow of current from the first electrode 140 or the second electrode 150 to the other of the second electrode 150 and the first electrode 140, respectively, passes through the first block pattern 120 and the second block pattern 106, respectively. More particularly, e.g., a current path between the first electrode 140 and the second electrode 150 passes through at least a portion of the first block pattern 120 and the second block pattern 106 such that current flowing along that current path passes through at least one of the first block pattern 120 and/or the second block pattern 106 before reaching the emitting pattern 114. For example, when the second electrode 150 is at a level that is higher than the first electrode 140 and the emitting pattern 114 is at a same and/or higher level than the first electrode 140 and at a lower level than the second electrode 150, the first block pattern 120 may be at a same and/or higher level than the first electrode 140 with at least a portion of the first block pattern 120 at a lower level than the emitting pattern 114, and at least a portion of the second block pattern 106 may be at a higher level than the emitting pattern 114 and at a same and/or lower level than the second electrode 150. If all of the first block pattern 120 is at a lower level than the first electrode 140, the first block pattern 120 may not affect current flow between the first electrode 140 and the second electrode 150.

The first block pattern 120 and/or the second block pattern 106 may regulate bias current applied to the first electrode 140 and/or the second electrode 150. The first block pattern 120 and/or the second block pattern 106 may increase light efficiency of the emitting structure 110. For example, the first block pattern 120 and the second block pattern 106 may increase light efficiency by, e.g., facilitating current flow through all and/or substantially all regions of the emitting pattern 114 at least within a light emitting region of the light emitting device 100, e.g., all and/or substantially all regions of the emitting pattern 114 at least partially within the cavity 142a corresponding to the light emitting region of the light emitting device 100. More particularly, by arranging the first block pattern 120 and the second block pattern 106 to be complementary, current flow through all and/or substantially all regions of the emitting pattern 114 may be facilitated.

Referring to FIG. 1, the buffer layer 104 may be on the first conductive pattern 112 and/or the second block pattern 106. The buffer layer 104 may protect the second block pattern 106 during laser lift off (LLO), as described below. The buffer layer 104 may also serve as a seed layer during formation, e.g., growth, of the first conductive pattern 112. The buffer layer 104 may improve crystallinity of the first conductive pattern 112, the emitting pattern 114 and/or the second conductive pattern 116. The buffer layer 104 may include, e.g., any material that may serve as a seed layer. The buffer layer 104 may include, e.g., $In_xAl_yG_{(1-x-y)}$, $Si_xC_yN_{(1-x-y)}$, where $0 \leq x \leq 1$ and $0 \leq y \leq 1$.

The second ohmic layer 145 may be on the buffer layer 104. The second ohmic layer 145 may include, e.g., ITO, Zn, ZnO, Ag, Ti, Al, Au, Ni, $In_2O_3$, $SnO_2$, Cu, W and/or Pt. The second ohmic layer 145 may facilitate current spreading and help avoid and/or reduce current crowding of, e.g., the current flowing between the second electrode 150 and the first conductive pattern 112. The second ohmic layer 145 may be transparent so as to enable light generated by the emitting structure 110 to be emitted.

The second electrode 150 may be on the second ohmic layer 145. The second electrode 150 may be electrically connected with the first conductive pattern 112. The second electrode 150 may include, e.g., ITO, Cu, Ni, Cr, Au, Ti, Pt, Al, V, W, Mo and/or Ag. The second electrode 150 may be at a level higher than the first electrode 140 and/or the emitting pattern 114 along, e.g., the z-direction. More particularly, in embodiments including a non-light emitting region and a light emitting region, e.g., the embodiment of FIG. 1, the second electrode 150 may overlap the cavity 142b corresponding to the non-light emitting region and may not overlap the cavity 142a corresponding to the light emitting region, i.e., the second electrode 150 may not block light emitted from the light emitting region.

Further, in some embodiments including one or more light emitting regions, e.g., 142a, and one or more non-light emitting regions, e.g., 142b, the first block pattern 120 and/or the second block pattern 106 may only be patterned to expose respective portions of the first and/or second electrodes 140, 150 in the light emitting region 142a while the first block pattern 120 and the second block pattern 106 may not be patterned and/or may completely overlap the first electrode 140 and the second electrode 150, respectively, in the non-light emitting region, e.g., 142b.

Figure 4A:
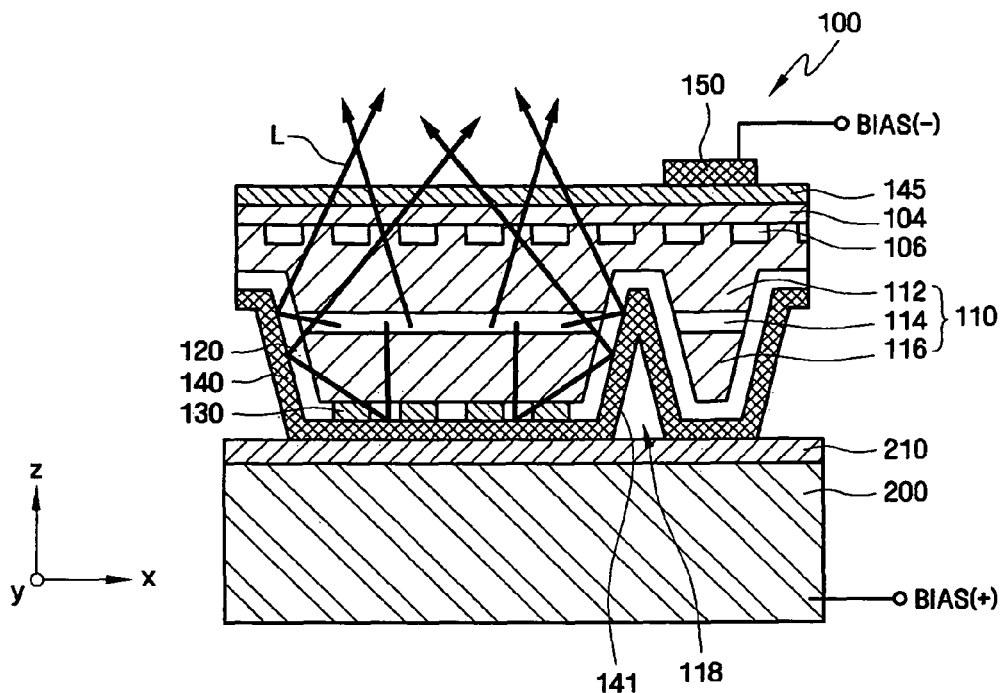
FIGS. 4A and 4B illustrate cross-sectional diagrams of exemplary light and current patterns, respectively, of the exemplary light emitting device of FIG. 1 during an operating state.
Figure 4B:
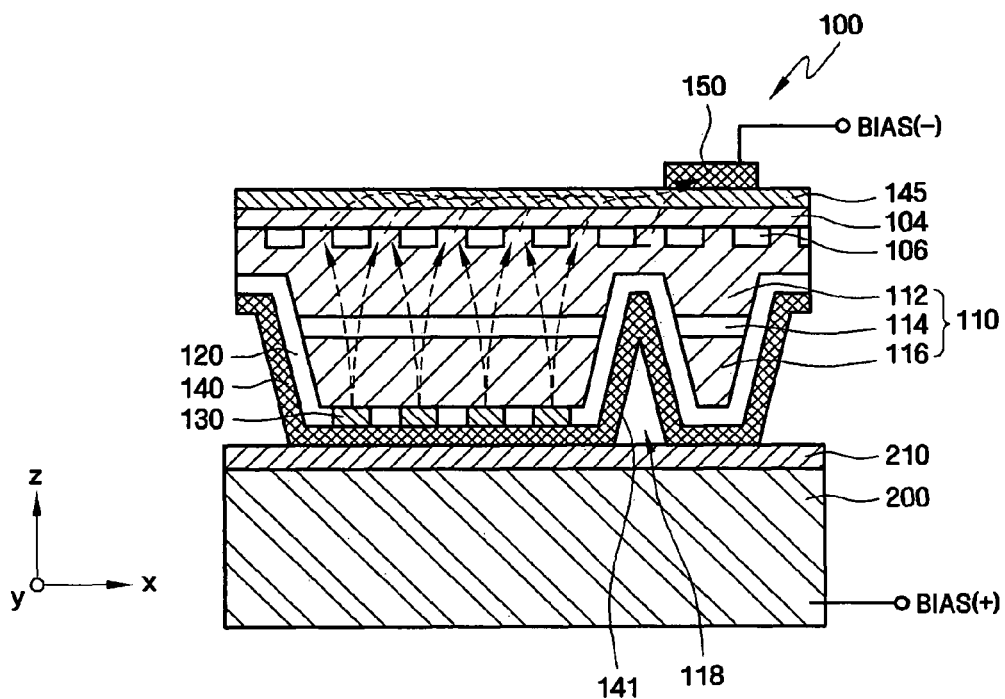

Referring to FIGS. 4A and 4B, exemplary light and current patterns of the light emitting device 100 shown in FIG. 1 during an operating state will be described below. For example, in some embodiments, the first conductive pattern 112 may be n-type and the second conductive pattern 116 may be p-type. In such embodiments, a first bias, e.g., a positive bias (V+ or I+) may be applied to the second conductive pattern 116 through the first electrode 140 and the first ohmic pattern 130 and a second bias, e.g., a negative bias (V− or I−) may be applied to the first conductive pattern 112. A forward bias may be applied to the emitting structure 110, and light may be generated at the emitting pattern 114. Referring to FIGS. 4A and 4B, in such a state, e.g., the flow of current through the emitting pattern 114 may generate light L, some of which may be directly emitted from the one or more openings defined by the second block pattern 106 and some of which may be reflected by the first electrode 140 and emitted through the one or more openings defied by the second block pattern 106. More particularly, as shown in FIG. 4B, during forward bias operation, the flow of current (see arrows in FIG. 4B) may be from the first electrode 140 to the second electrode 150. The first block pattern 120 and/or the second block pattern 106 may regulate current. More particularly, e.g., in embodiments in which the first block pattern 120 and the second block pattern 106 are arranged complementary to each other, current may flow through all and/or substantially all regions of the emitting pattern 114. In embodiments in which current may flow through all and/or substantially all regions of the emitting pattern 114, light efficiency may be improved, e.g., higher.

Figure 5:
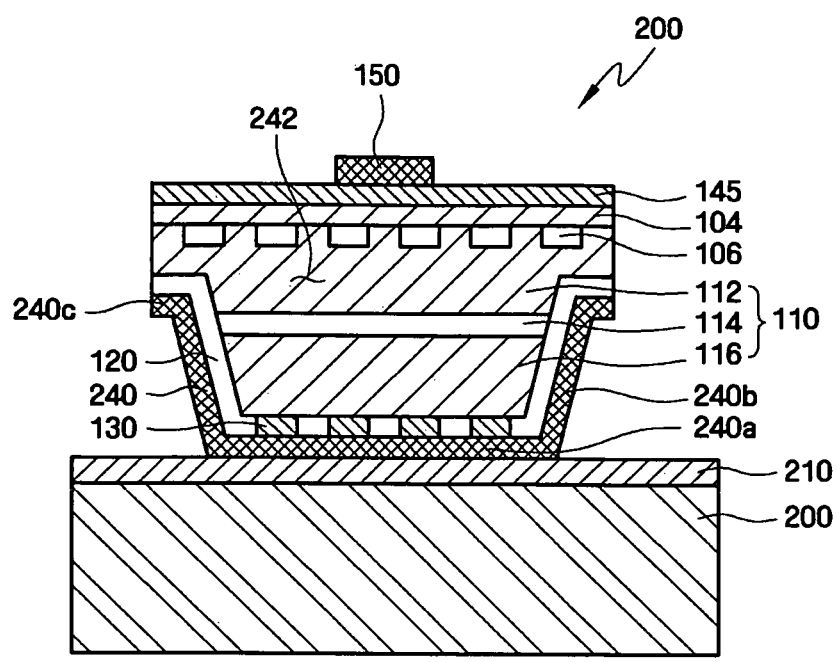
FIG. 5 illustrates a cross-sectional view of a light emitting device according to a second exemplary embodiment employing one or more aspects of the invention.

FIG. 5 illustrates a cross-sectional view of a light emitting device 200 according to a second exemplary embodiment employing one or more aspects of the invention. In general, only differences between the light emitting device 200 and the light emitting device 100 of FIG. 1 will be described below.

Referring to FIG. 5, the light emitting device 200 may include a first electrode 240. The first electrode 240 may include a bottom portion 240a and side portion(s) 240b. However, in contrast to the first electrode 140 of the exemplary light emitting device 100 of FIG. 1, the first electrode 240 of the exemplary light emitting device 200 does not include protrusions 141. The side portions 240b of the first electrode 240 of the exemplary light emitting device 200 may define a cavity 242. More particularly, the first electrode 240 of the light emitting device 200 may include only one cavity 242. That is, e.g., in some embodiments, the light emitting device 200 may not include a cavity corresponding to a non-light emitting region. The emitting pattern 114 may be at least partially within the cavity 242. The second electrode 150 may overlap the cavity 242.

Figure 6:
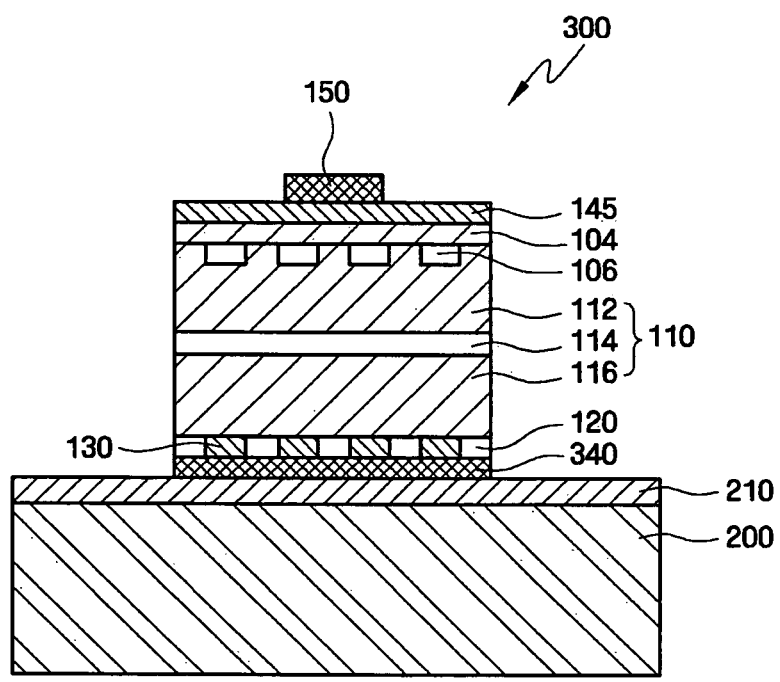
FIG. 6 illustrates a cross-sectional view of a light emitting device according to a third exemplary embodiment employing one or more aspects of the invention.

FIG. 6 illustrates a cross-sectional view of a light emitting device 300 according to a third exemplary embodiment employing one or more aspects of the invention. In general, only differences between the light emitting device 300 and the light emitting device 100 of FIG. 1 will be described below.

Referring to FIG. 6, the light emitting device 300 may include a first electrode 340. The first electrode 340 may conform to a shape of the intermediate layer 210 and/or a side of the conductive substrate 200 on which it is arranged. For example, if the first electrode 340 is arranged on a side of the conductive substrate 200 that is substantially planar, the first electrode 340 may extend substantially along a plane. In contrast to the first electrode 140 of the light emitting device 100 of FIG. 1, the first electrode 340 of the light emitting device 300 may not include any side portion(s) 140b and/or any protrusion(s) 141. Further, the first electrode 340 of the light emitting device 300 may not define any cavities. In the exemplary light emitting device 300, the first electrode 340 is arranged only along a bottom of the emitting structure 110.

Figure 7A:
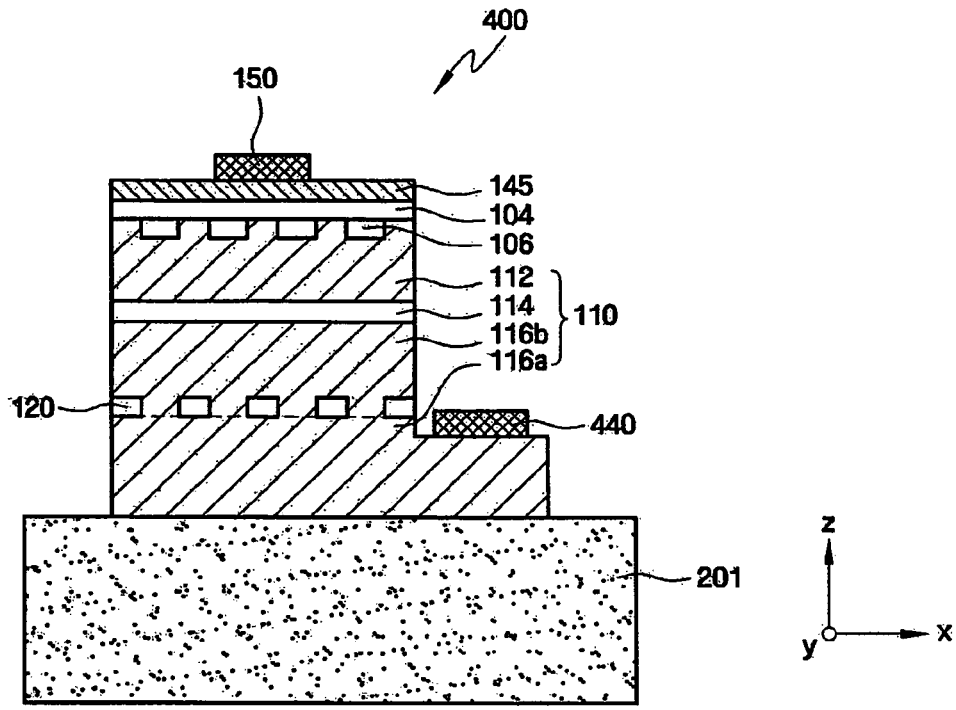
FIGS. 7A and 7B illustrate cross-sectional views of a light emitting device according to a fourth exemplary embodiment employing one or more aspects of the invention.
Figure 7B:
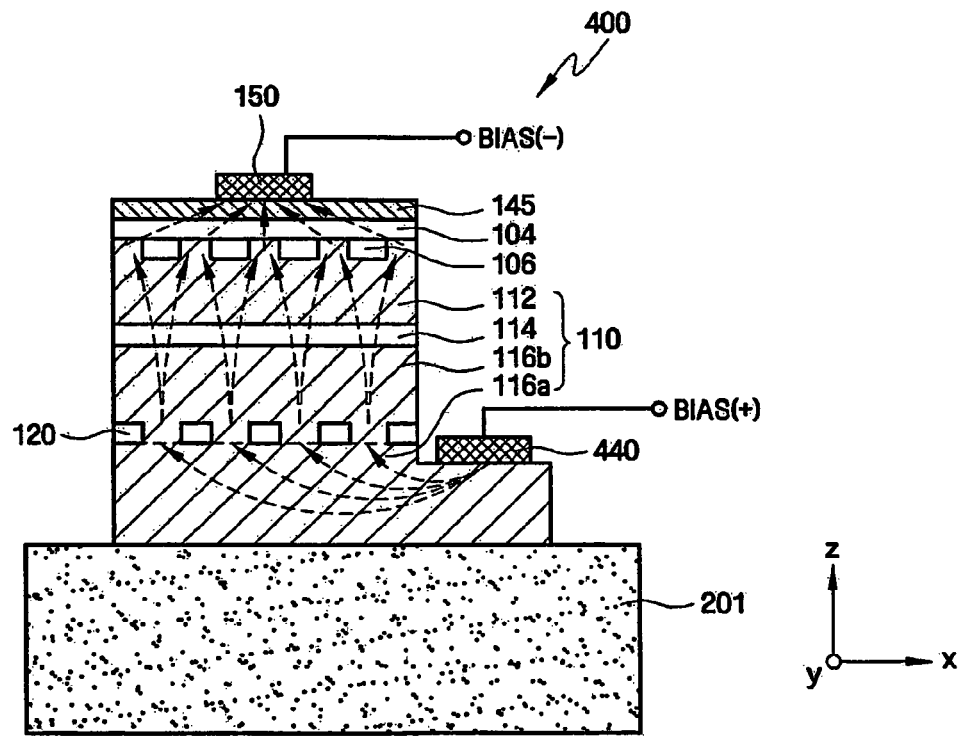

FIGS. 7A and 7B illustrate cross-sectional views of a light emitting device 400 according to a fourth exemplary embodiment employing one or more aspects of the invention. In general, only differences between the light emitting device 400 and the light emitting device 100 of FIG. 1 will be described below.

Further, one or more aspects of the invention may be applied to a lateral type light emitting device. Referring to FIG. 7A, e.g., the light emitting device 400 may include a first electrode 440, a second conductive pattern first portion 116a and a second conductive pattern second portion 116b, and a substrate 201. The substrate 201 may include, e.g., $Al_2O_3$, ZnO, Si and/or SiC, etc. The second conductive pattern first portion 116a may be on, e.g., directly on, the substrate 201. The first electrode 440 may be on the second conductive pattern first portion 116a, e.g., on a portion thereof protruding beyond the emitting structure 110. The first block pattern 120 may be arranged between the second conductive pattern first portion 116a and the second conductive pattern second portion 116b. At least a portion of the first electrode 440 may be on a same level as a portion of the first block pattern 120 relative to the substrate 201. The light emitting device 400 may not include an ohmic pattern between the substrate 201 and the second conductive pattern first portion 116a.

Referring to FIG. 7B, exemplary operation of the light emitting device 400 shown in FIG. 7A will be described below. For example, in some embodiments, the first conductive pattern 112 may be n-type and the second conductive pattern portions 116a, 116b may be p-type. In such embodiments, a first bias, e.g., a positive bias (V+ or I+) may be applied to the second conductive pattern portions 116a, 116b through the first electrode 440 and a second bias, e.g., a negative bias (V− or I−) may be applied to the first conductive pattern 112. A forward bias may be applied to the emitting structure 110, and light may be generated at the emitting pattern 114. During forward bias operation, current may flow from the first electrode 140 to the second electrode 150. The first block pattern 120 and/or the second block pattern 106 may regulate current through the emitting pattern 114. More particularly, e.g., in embodiments in which the first block pattern 120 and the second block pattern 106 are arranged complementary to each other, current may flow through all and/or substantially all regions of the emitting pattern 114. In embodiments in which current may flow through all and/or substantially all regions of the emitting pattern 114, light efficiency may be improved, e.g., increased.

Exemplary embodiments of light emitting apparatus employing one or more aspects of the invention will be described below. It should be understood that while the exemplary apparatus may be described employing one of the exemplary light emitting devices described above, embodiments are not limited thereto. Other light emitting devices employing one or more aspects of the invention may be employed.

Figure 8:
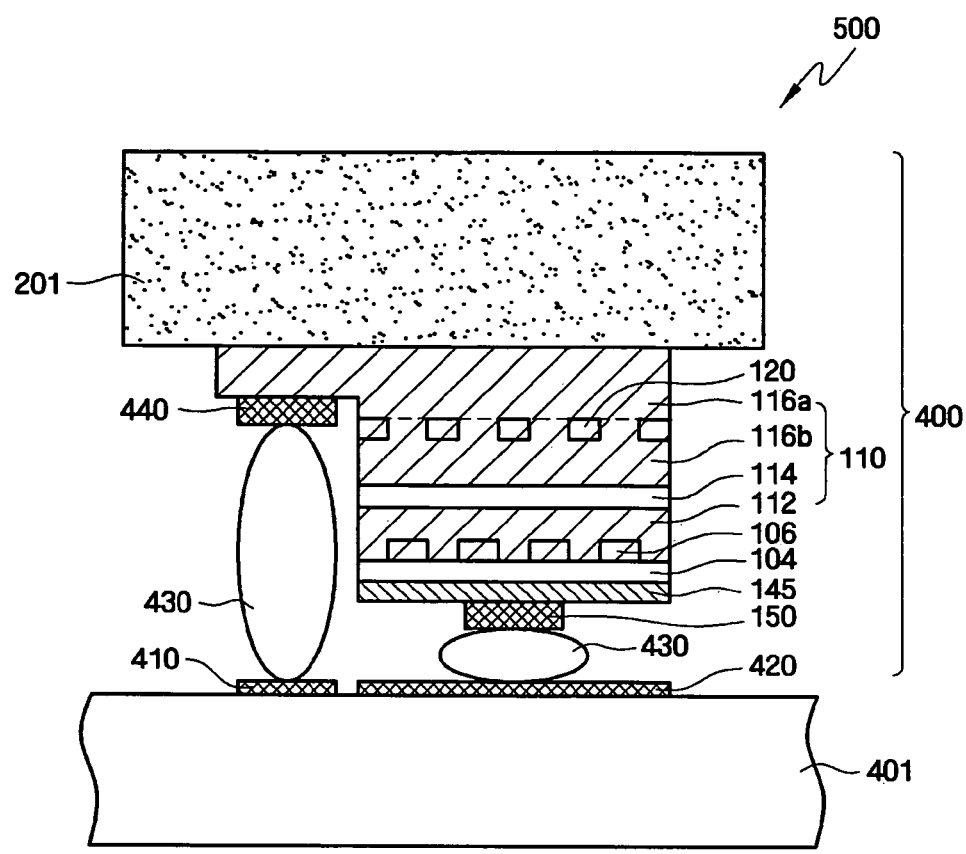
FIG. 8 illustrates a cross-sectional view of a light emitting apparatus according to a first exemplary embodiment employing one or more aspects of the invention.

FIG. 8 illustrates a cross-sectional view of a light emitting apparatus 500 according to a first exemplary embodiment employing one or more aspects of the invention.

Referring to FIG. 8, the light emitting apparatus 500 may include a substrate, e.g., circuit board 401, a first conductive region 410, a second conductive region 420, solder bumps 430 and the light emitting device 400 of FIGS. 7A and 7B. More particularly, the light emitting device 400 may be connected to the circuit board 401 in a flip-chip manner. The first conductive region 410 may be electrically separated from the second conductive region 420. The first electrode 440 of the light emitting device 400 may be electrically connected to the first conductive region 410 on the circuit board 401 and the second electrode 150 may be electrically connected to the second conductive region 420 on the circuit board 401. Solder bumps 430 may be employed to electrically connect the first electrode 440 to the first conductive region 410 and the second electrode 150 to the second conductive region 420, respectively. In such embodiments, wire bonding may not be employed to connect the first electrode 440 to the first conductive region 410 and the second electrode 150 to the second conductive region 420, respectively.

Figure 9A:
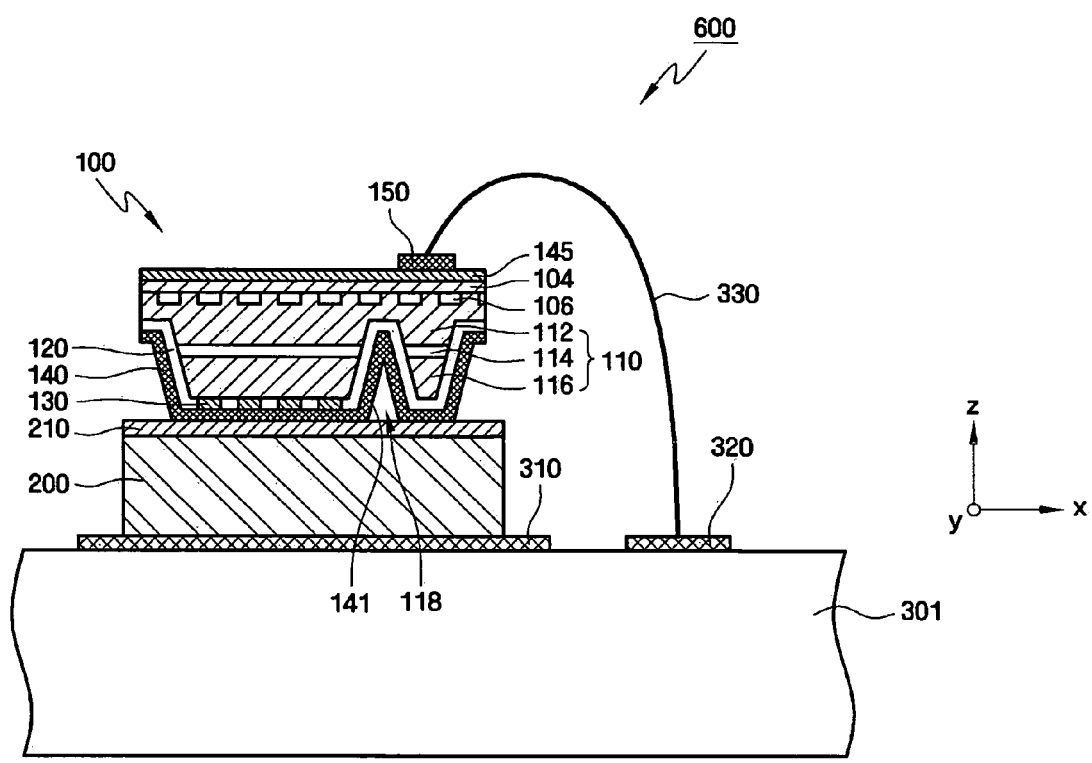
FIGS. 9A and 9B respectively illustrate a cross-sectional view and a top-side view of a light emitting apparatus according to a second exemplary embodiment employing one or more aspects of the invention.
Figure 9B:
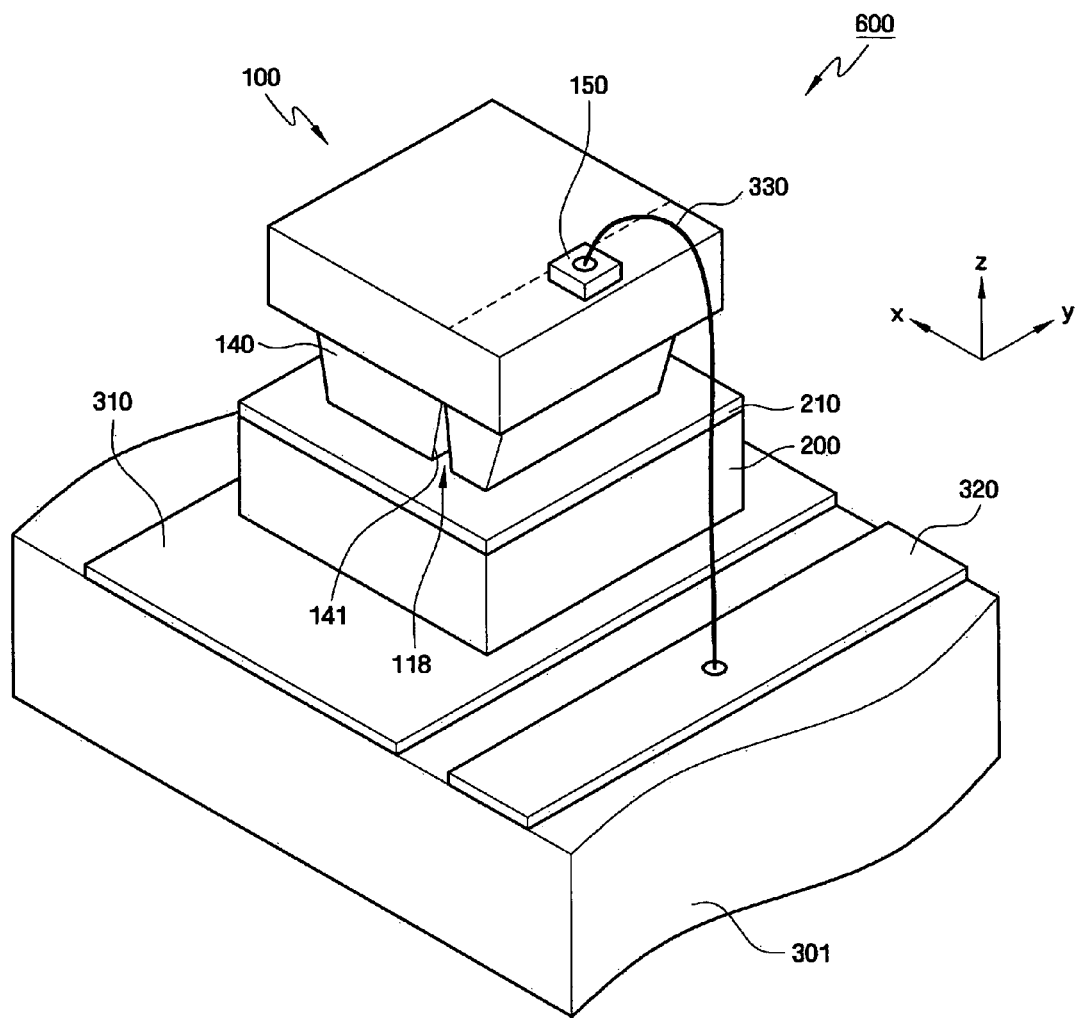

FIGS. 9A and 9B respectively illustrate a cross-sectional view and a top-side view of an emitting apparatus 600 according to a second exemplary embodiment employing one or more aspects of the invention.

Referring to FIGS. 9A and 9B, the emitting apparatus 600 may include the light emitting device 100 of FIG. 1 arranged on a conductive substrate, e.g., circuit board 301. The circuit board 301 may include a first conductive region 310 and a second conductive region 320. The first conductive region 310 may be electrically separated from the second conductive region 320. The first conductive region 310 and the second conductive region 320 may be arranged on a same surface or side of the circuit board 301. As illustrated in FIGS. 9A and 9B, the first conductive region 310 may be electrically connected with the conductive substrate 200 of the light emitting device 100 and the second conductive region 320 may be electrically connected with the second electrode 150. More particularly, e.g., the second conductive region 320 may be electrically connected to the second electrode 150 through wire bonding.

Figure 10:
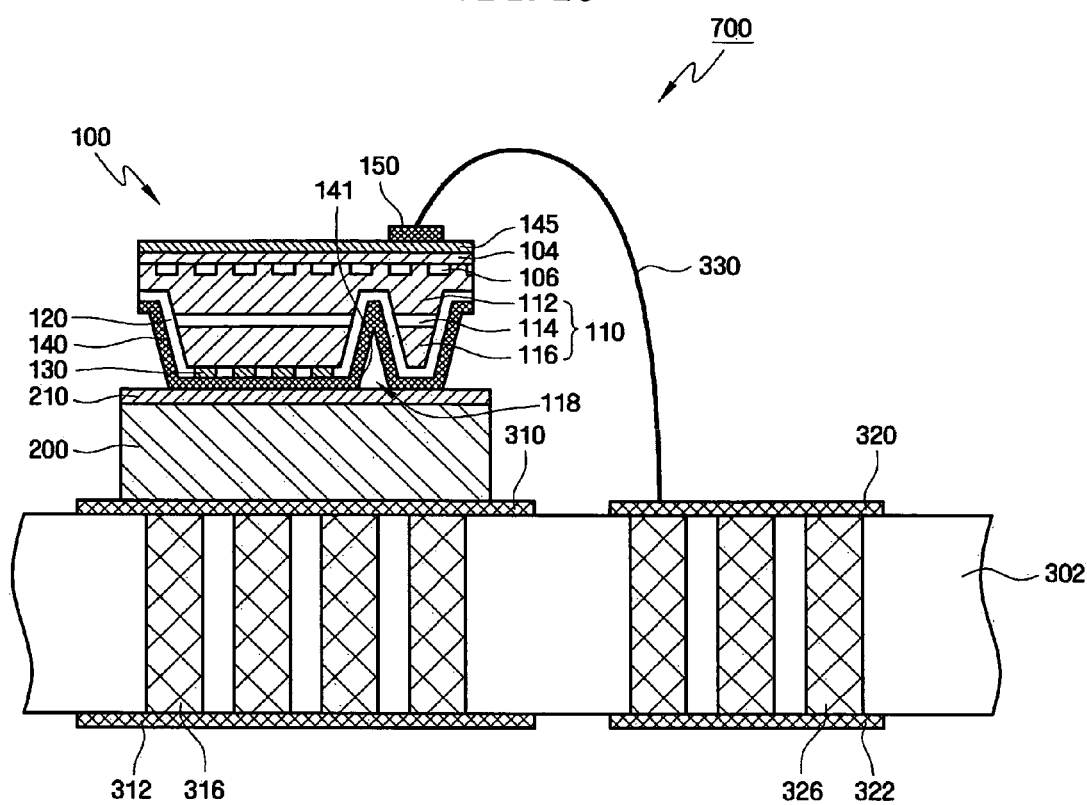
FIG. 10 illustrates a cross-sectional view of a light emitting apparatus according to a third exemplary embodiment employing one or more aspects of the invention.

FIG. 10 illustrates a cross-sectional view of a light emitting apparatus 700 according to a third exemplary embodiment employing one or more aspects of the invention.

Referring to FIG. 10, the light emitting apparatus 700 may include a conductive substrate, e.g., circuit board 302, including a plurality of conductive regions and vias. More particularly, the light emitting apparatus 700 may include the first conductive region 310 and the second conductive region 320 on a first surface or side of the circuit board 302 and a third conductive region 312 and a fourth conductive region 322 on a second surface or side of the circuit board 302. The first conductive region 310 may be electrically separated from the second conductive region 320. The third conductive region 312 may be electrically separated from the fourth conductive region 322. The first conductive region 310 may be electrically connected to the third conductive region 310 through a first via(s) 316. The second conductive region 320 may be electrically connected to the fourth conductive region 322 through a second via(s) 326. The first conductive region 310 may be electrically connected with the conductive substrate 200 of the light emitting device 100. The second conductive region 320 may be electrically connected with the second electrode 150 of the light emitting device 100. In such embodiments, the conductive regions, e.g., the first conductive region 310, the second conductive region 320, the third conductive region 31 and/or the fourth conductive region 322 may be electrically connected with patterns on a plurality of sides, e.g., two sides, e.g., front and back sides, of the circuit board 302.

Figure 11:
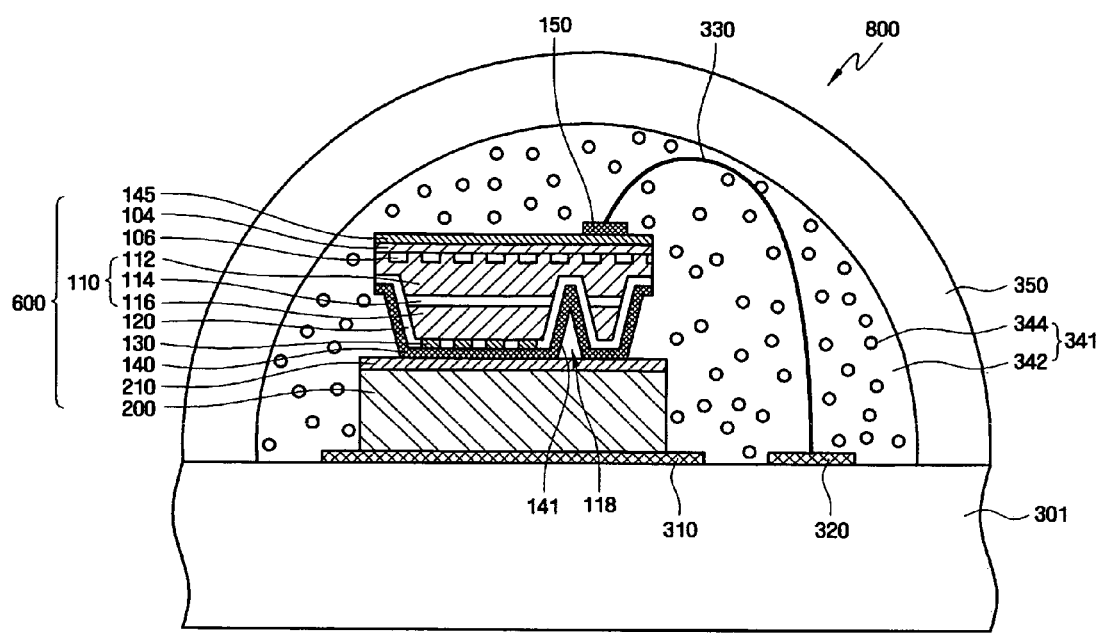
FIG. 11 illustrates a cross-sectional view of a phosphor layer in the light emitting apparatus of FIG. 9A according to a first exemplary embodiment employing one or more aspects of the invention.
Figure 12:
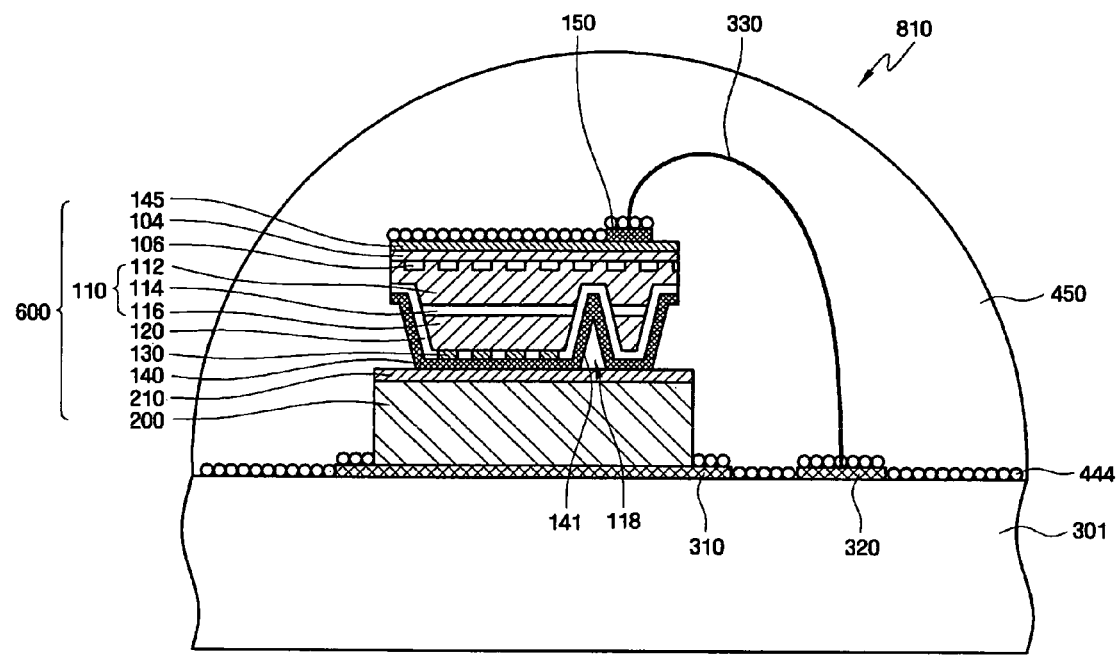
FIG. 12 illustrates a cross-sectional view of a phosphor layer in the light emitting apparatus of FIG. 9A according to a second exemplary embodiment employing one or more aspects of the invention.
Figure 13:
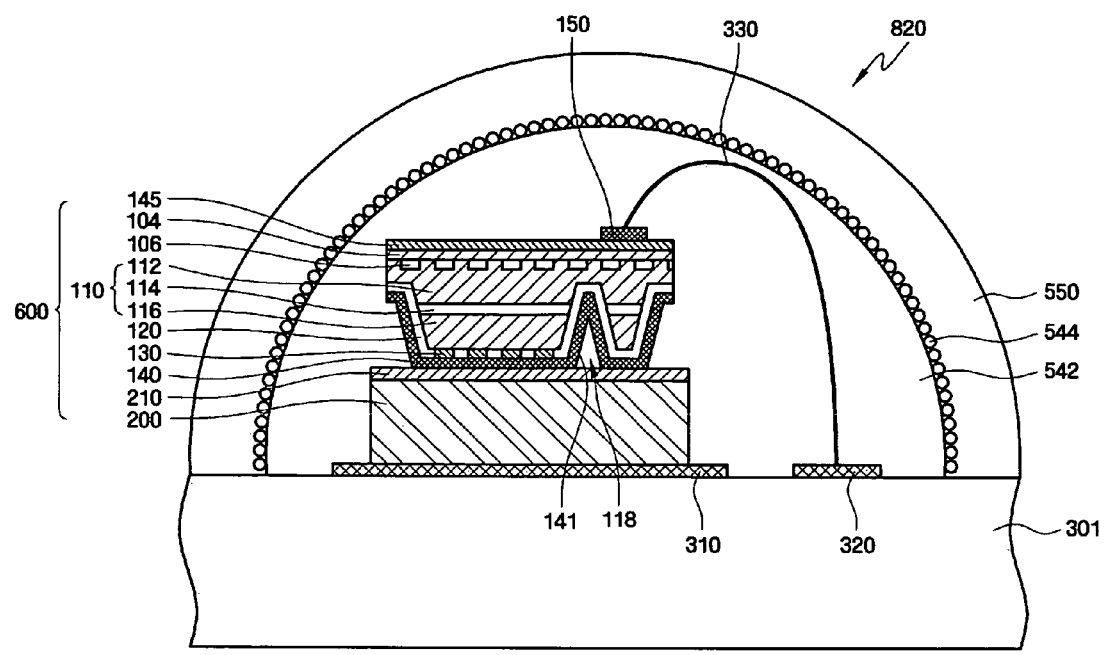
FIG. 13 illustrates a cross-sectional view of a phosphor layer in the light emitting apparatus of FIG. 9A according to a third exemplary embodiment employing one or more aspects of the invention.

FIG. 11 illustrates a cross-sectional view of a light emitting apparatus 800 according to a fourth exemplary embodiment employing one or more aspects of the invention. FIG. 12 illustrates a cross-sectional view of a light emitting apparatus 810 according to a fifth exemplary embodiment employing one or more aspects of the invention. FIG. 13 illustrates a cross-sectional view of a light emitting apparatus 820 according to a sixth exemplary embodiment employing one or more aspects of the invention. More particularly, FIGS. 11, 12 and 13 illustrate exemplary embodiments of a phosphor layer employable in a light emitting apparatus employing a light emitting device according to one or more aspects of the invention, e.g., the light emitting apparatus 600 of FIGS. 9A and 9B. In general, only differences between the exemplary embodiments of FIGS. 11, 12 and 13 will be described below.

Referring to FIG. 11, the light emitting apparatus 800 may include a phosphor layer 341. The phosphor layer 341 may include a first transparent resin 342 and phosphor 344. The phosphor 344 may be dispersed in the phosphor layer 341. More particularly, the phosphor 344 may be dispersed on and/or within the first transparent resin 342. The phosphor layer 341 may be formed over the light emitting device 600. For example, the phosphor layer 341 may completely cover the light emitting device 600 on the circuit board 301. A second transparent resin 350 may be formed on the phosphor layer 341. The second transparent resin 350 may completely cover the phosphor layer 340 on the circuit board 301. The second transparent resin 350 may include a lens shape. The second transparent resin 350 may diffuse light generated by the emitting device 600. The phosphor layer 341 and the circuit board 301 may together substantially encapsulate the light emitting device 600.

Referring to FIG. 11, the phosphor 344 may be dispersed within the transparent resin 342. The phosphor 344 may absorb light generated by the emitting device 600 and may convert the light to light of a different wavelength, e.g., different color. The phosphor 344 may include, e.g., nitride-based and/or oxide-based material that may be activated by lanthanide(s), e.g., Eu, Ce, etc.

Referring to FIG. 12, in some other exemplary embodiments, the light emitting apparatus 810 may include phosphor 444 on the light emitting device 600, e.g., directly on the second ohmic layer 145 and/or the second electrode 150. More particularly, e.g., the phosphor 444 may be directly and conformally formed on the light emitting device 600, i.e., along a profile of the light emitting device 600 and/or the circuit board 301. A transparent resin 450 may be formed over the phosphor 444 and the light emitting device 600.

Referring to FIG. 13, in some other embodiments, e.g., the light emitting apparatus 820 may include a first transparent resin 542 on the light emitting device 600, phosphor 544 on the first transparent resin 542 and a second transparent resin 550 on the phosphor 544. That is, e.g., the phosphor 544 may be between the first transparent resin 542 and the second transparent resin 550.

Figure 14:
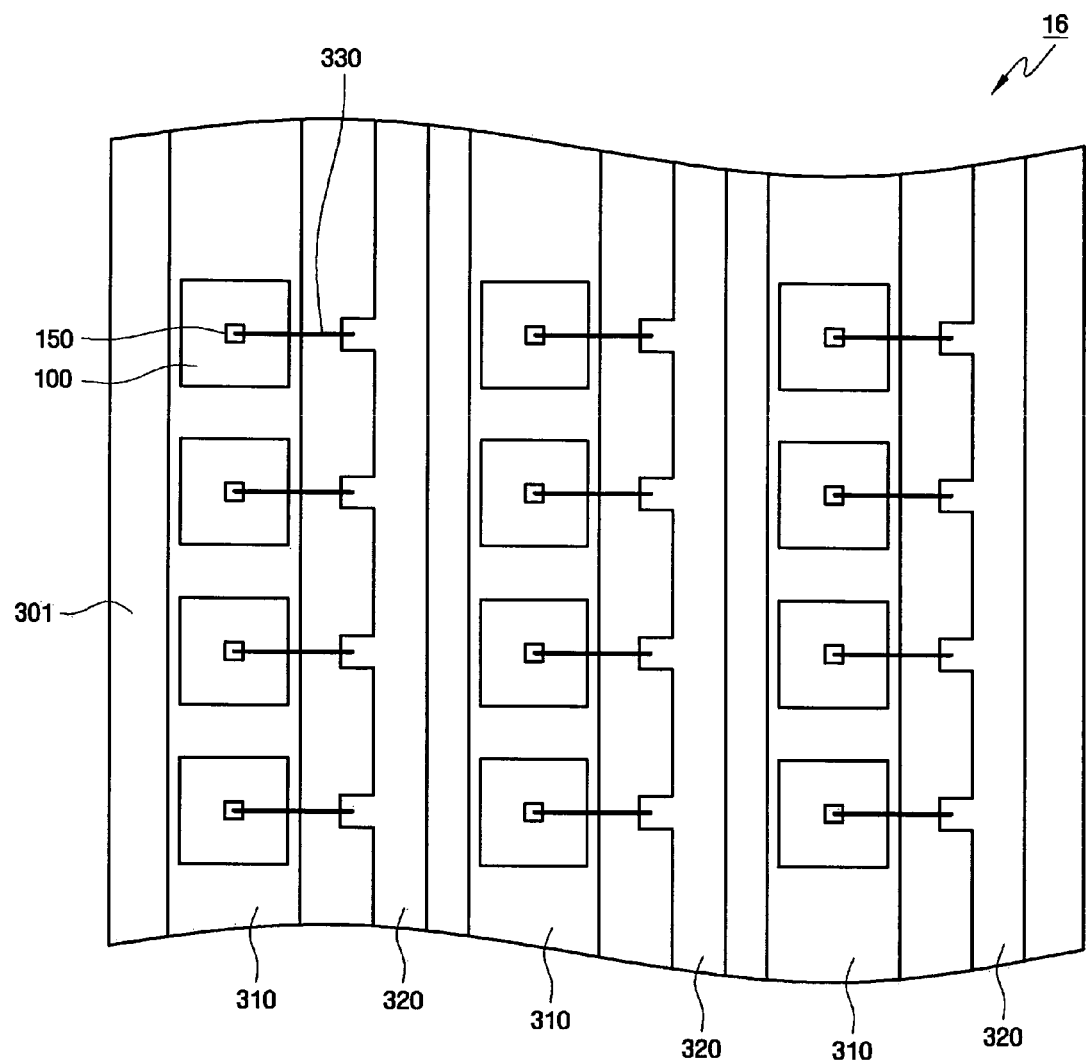
FIG. 14 illustrates a general schematic diagram of exemplary first and second conductive regions of an exemplary emitting apparatus.

FIG. 14 illustrates a general schematic diagram of exemplary first and second conductive regions 310, 320 that may be employed with an emitting apparatus according to one or more aspects of the invention, e.g., the emitting apparatus 800 of FIG. 11. More particularly, e.g., the light emitting devices, e.g., 100 of FIG. 1, may be arranged in a matrix pattern on the circuit board 301. The first conductive region 310 and the second conductive region 320 may be elongated and alternately arranged in parallel on the circuit board 301. The first conductive region 310 may substantially and/or completely overlap the light emitting device 100. The second conductive region 320 and the second electrode 150 of the light emitting device 100 may be electrically connected via a wire 330.

Figure 15A:
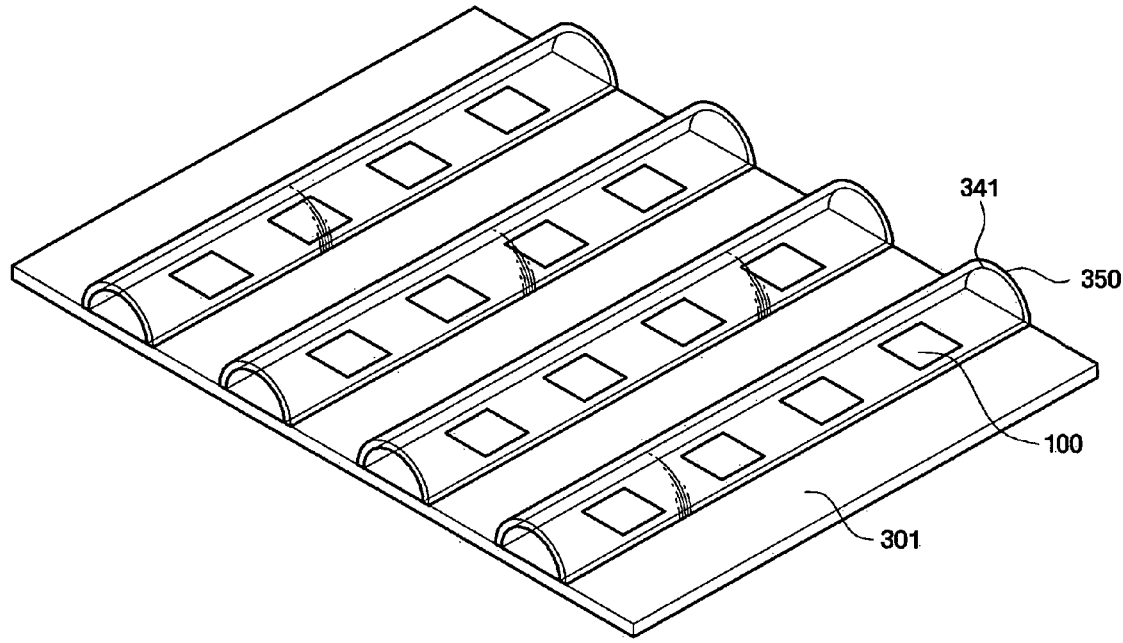
FIGS. 15A and 15B illustrate exemplary arrangements of the phosphor and the second transparent resin of FIG. 11.
Figure 15B:
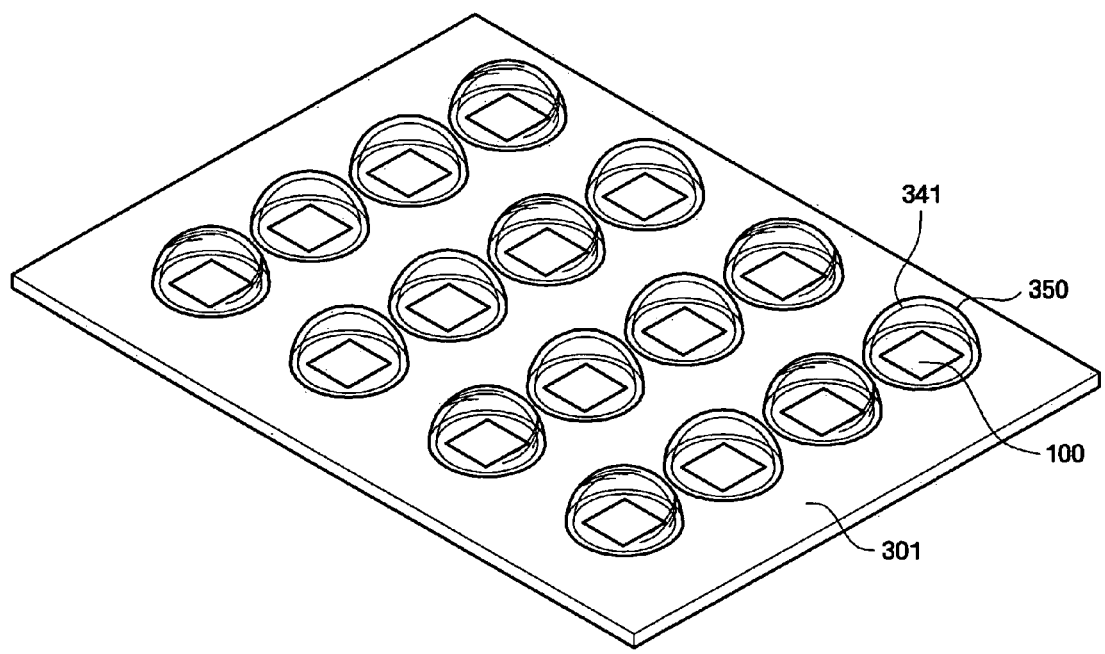

FIGS. 15A and 15B illustrate exemplary arrangements of the phosphor 341 and the second transparent resin 350 of FIG. 11. In some embodiments, the phosphor layer 341 and the second transparent resin 350 may be line-type and/or dot-type, etc. More particularly, referring to the exemplary embodiment of FIG. 15A, in the line-type manner, a single strip of the phosphor layer 341 and the second transparent resin 350 may overlap a plurality of the light emitting devices 100. In such embodiments, the light emitting devices, e.g., 100 of FIG. 1, may be arranged, e.g., in a matrix manner. Referring to FIG. 15B, in the dot-type manner, e.g., each portion of the phosphor layer 341 and the second transparent resin 350 may overlap a single one of the light emitting devices 100.

It is understood that while the exemplary light emitting device 100 of FIG. 1 is illustrated in FIGS. 14, 15A and 15B, embodiments are not limited thereto, as other light emitting devices, e.g., 200, 300 of FIGS. 5 and 6, respectively, may be employed. Further, while the exemplary phosphor layer 341 and second transparent resin 350 of FIG. 11 is illustrated in FIGS. 15A and 15B, embodiments are not limited thereto. For example, the exemplary phosphor 444 and transparent resin 450 of FIG. 12 may be arranged in the dot-type and/or line-type manner of FIGS. 15A and 15B.

Figure 16:
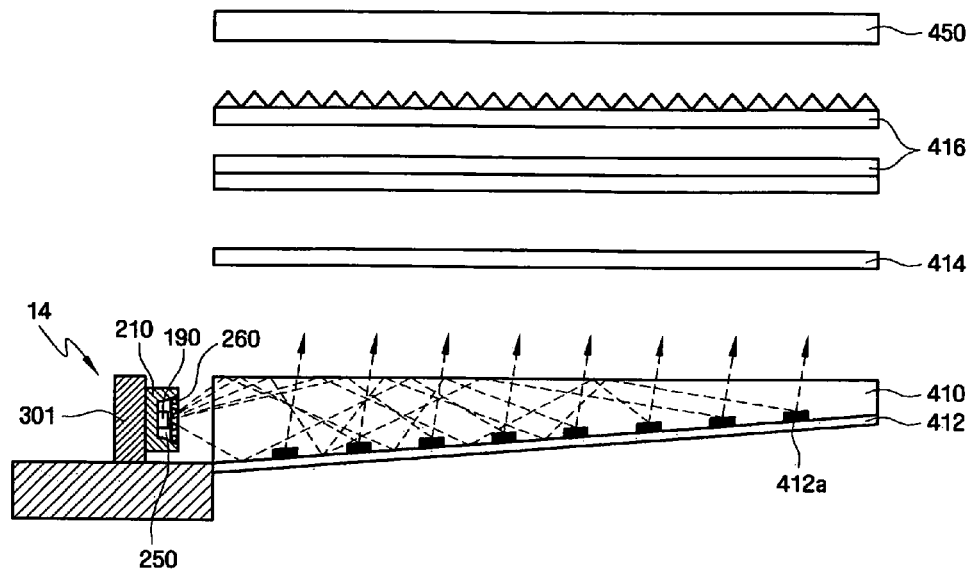
FIG. 16 illustrates a cross-sectional diagram of an exemplary back light employing a light emitting device employing one or more aspects of the invention.

FIG. 16 illustrates a cross-sectional diagram of an exemplary back light employing a light emitting device 190 employing one or more aspects of the invention. The light emitting device 190 may be, e.g., the light emitting device 100 of FIG. 1, the light emitting device 300 of FIG. 6, etc. The back light may include an emitting package 14 including the light emitting device 190, a package body 210, a circuit board 301, a transparent resin 250 and phosphor layer 260. The phosphor layer 260 may, e.g., be like the phosphor 544 of FIG. 13. As illustrated in FIG. 16, the back light may further include a reflective sheet 412, a pattern 412a, a transfer sheet 410, a spreading sheet 414, a prism sheet(s) 416 and a display panel 450. Embodiments are not limited to the exemplary arrangement illustrated in FIG. 16. For example, in some embodiments, the reflective sheet 412 may be parallel to a front face of the transfer sheet 410 and/or a plurality of light emitting devices 190 may be arranged across the reflective sheet 412.

Figure 17:
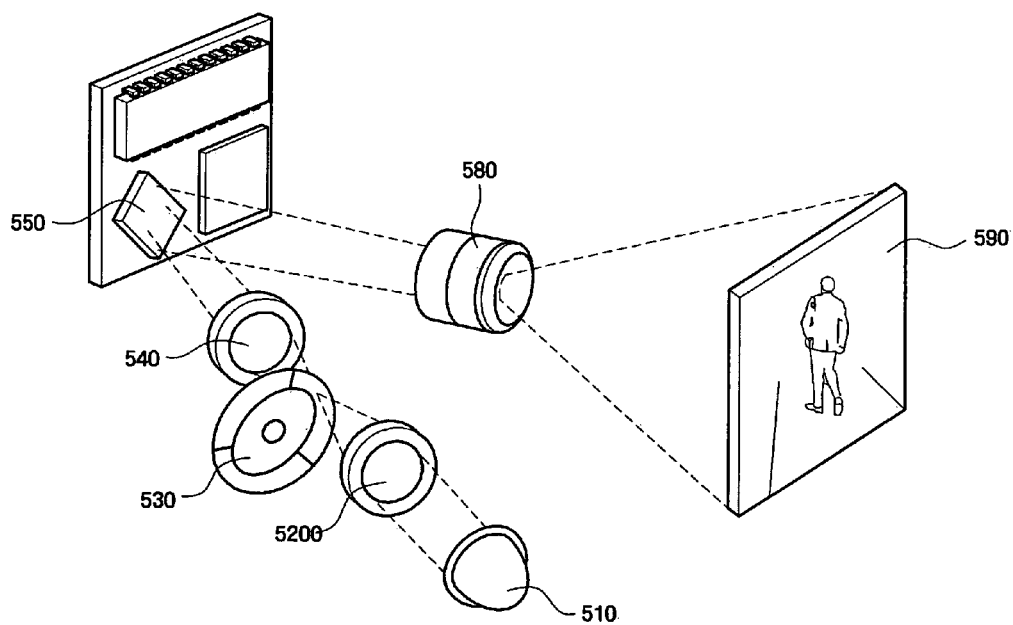
FIG. 17 illustrates a diagram of an exemplary projector employing a light emitting device employing one or more aspects of the invention.

FIG. 17 illustrates a diagram of an exemplary projector employing a light emitting device 510 employing one or more aspects of the invention. Referring to FIG. 17, the projector may include the light source 510, a condensing lens 520, a color filter 530, e.g., rotatable color filter, a shaping lens 540, a digital micromirror device (DMD) 550, a projection lens 580. Light from the light source 510 may pass through the condensing lens 520, the color filter 530 and the shaping lens 540, be reflected by the DMD 550 and pass through the projection lens 580 before forming an image on the screen 590. The projector may project an image on the screen 590. More particularly, the light source 510 may include a sub mount substrate and a light emitting device according to one or more aspects of the invention, e.g., the light emitting device 100 of FIG. 1, the light emitting device 300 of FIG. 6, etc.

Figure 18A:
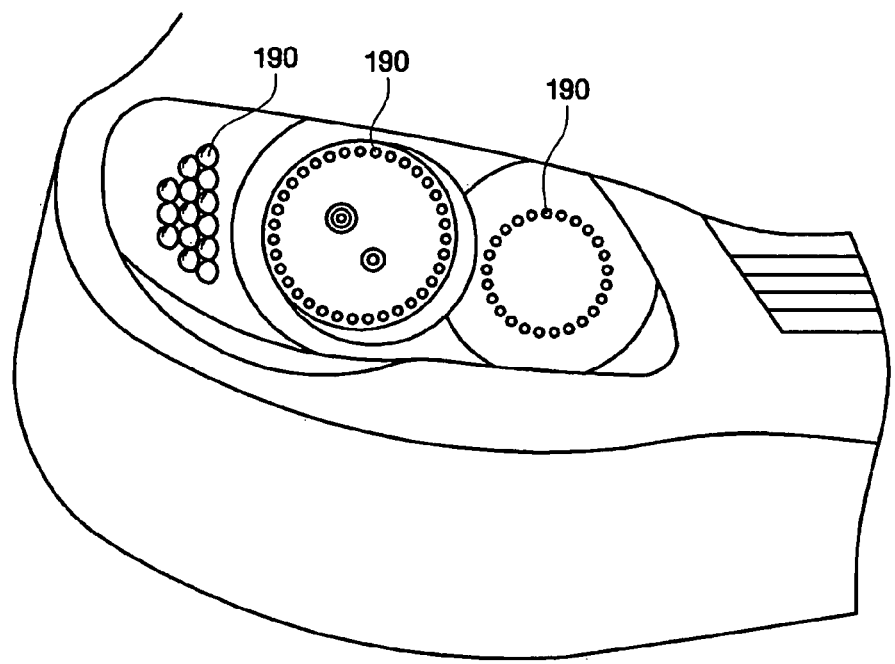
FIGS. 18A, 18B and 18C illustrate exemplary illuminating devices employing a light emitting device employing one or more aspects of the invention.
Figure 18B:
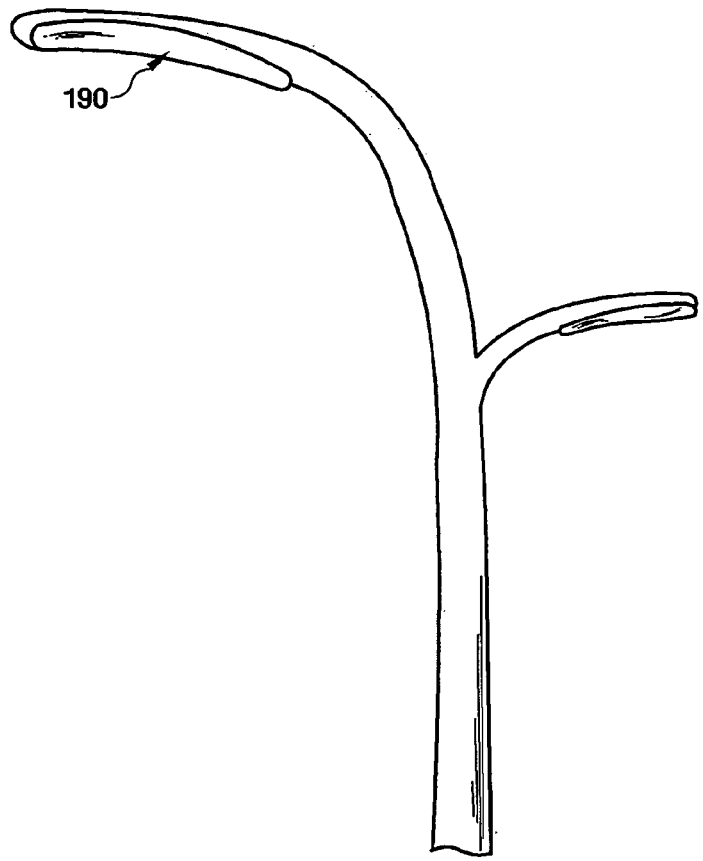
Figure 18C:
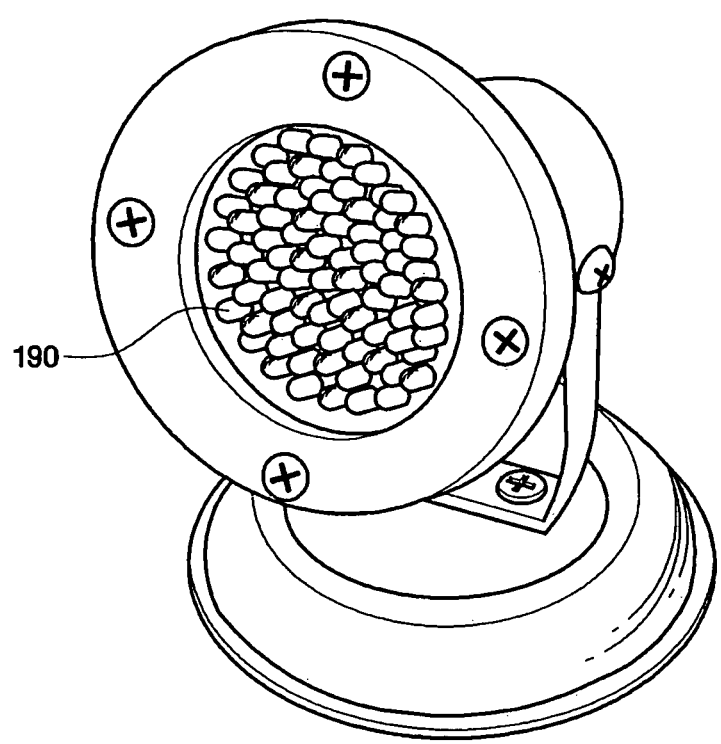

FIGS. 18A, 18B and 18C illustrate exemplary illuminating devices employing the light emitting device 190 employing one or more aspects of the invention. More particularly, FIGS. 18A, 18B and 18C illustrate an automobile head lamp, a street lamp and an illumination light, respectively, which may each include one or more of the light emitting device(s), e.g., 100 of FIG. 1, 200 of FIG. 5, 300 of FIG. 6, etc., to project light.

FIGS. 19A, 19B, 19C, 19D, 19E, 19F, 19G, 19H and 19I illustrate stages in an exemplary method for fabricating the exemplary light emitting device 100 of FIG. 1.

Figure 19A:
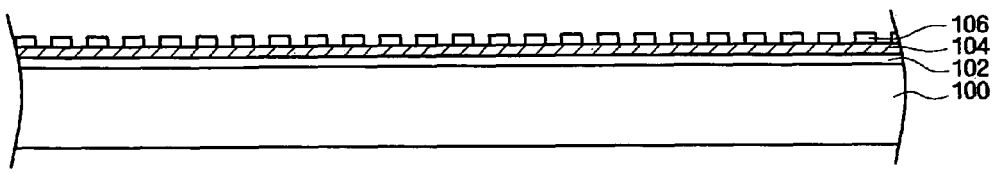
FIGS. 19A, 19B, 19C, 19D, 19E, 19F, 19G, 19H and 19I illustrate stages in an exemplary method for fabricating the exemplary light emitting device of FIG. 1.

Referring to FIG. 19A, to fabricate the light emitting device 100, a sacrificial layer 102 may be formed on a substrate 100. The buffer layer 104 may be formed on the sacrificial layer 102. The second block pattern 106 may be formed on the buffer layer 104. The buffer layer 104 may protect the second block pattern 106 during LLO and may serve as a seed layer for growing the first conductive pattern 112. The second block pattern 106 may be patterned as a line-type, a mesh-type, a dot-type, etc.

Figure 19B:
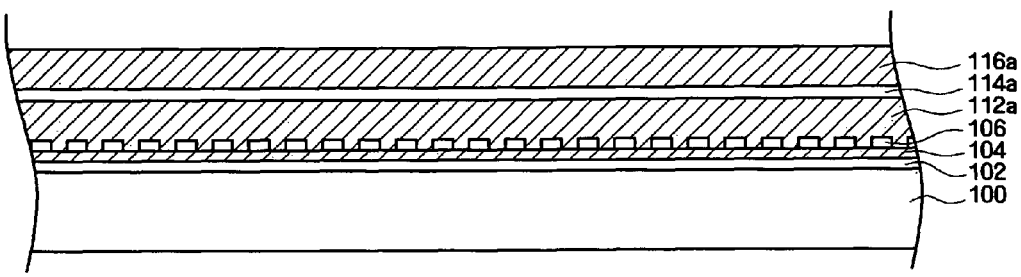

Referring to FIG. 19B, a first conductive layer 112a, an emitting layer 114a and a second conductive layer 116a may be successively formed on the buffer layer 104. The first conductive layer 112a, the emitting layer 114a and the second conductive layer 116a may be formed using, e.g., metal organic chemical vapor deposition (MOCVD), liquid phase epitaxy, hydride vapor phase epitaxy, molecular beam epitaxy and/or metal organic vapor phase epitaxy, etc. By forming the second block pattern 106 having one or more openings therein to expose the buffer layer 104, the buffer layer 104 may be used as a seed layer and the first conductive layer 112a, the emitting layer 114a and the second conductive layer 116a may be formed using, e.g., lateral epitaxial overgrowth (LEO).

Figure 19C:
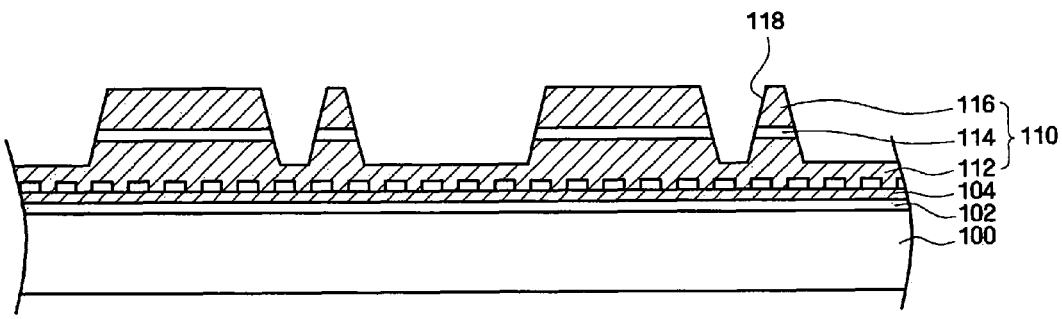

Referring to FIG. 19C, the emitting structure 110 may be formed by etching. That is, the first conductive layer 112a, the emitting layer 114a and/or the second conductive layer 116a may be etched to respectively form the first conductive pattern 112, the emitting pattern 114 and the second conductive pattern 116. In some embodiments, the emitting structure 110 may include sloped sides. More particularly, as shown in FIG. 19C, in some embodiments, the structure shown in FIG. 19B may be etched such that a base portion of the remaining protruding structure(s) is wider than an upper portion thereof, i.e., a width of the groove 118 decreases towards a base of the groove 118.

Figure 19D:
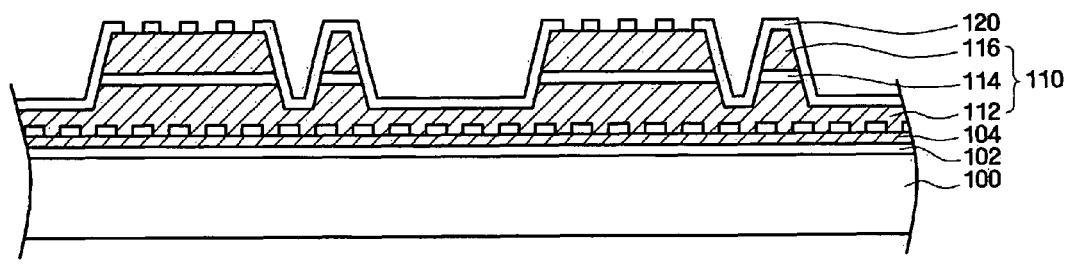

Referring to FIG. 19D, a first block layer may be formed on the emitting structure 110 and patterned to form the first block pattern 120. More particularly, e.g., the first block layer may be conformally formed on a profile of the emitting structure 110. Further, referring to FIG. 19D, portions of the first block layer, e.g., upper portions of the first block layer on an upper surface of the second conductive pattern 116, may be patterned to form the first block pattern 120 and to expose respective portions of the second conductive pattern 116.

Figure 19E:
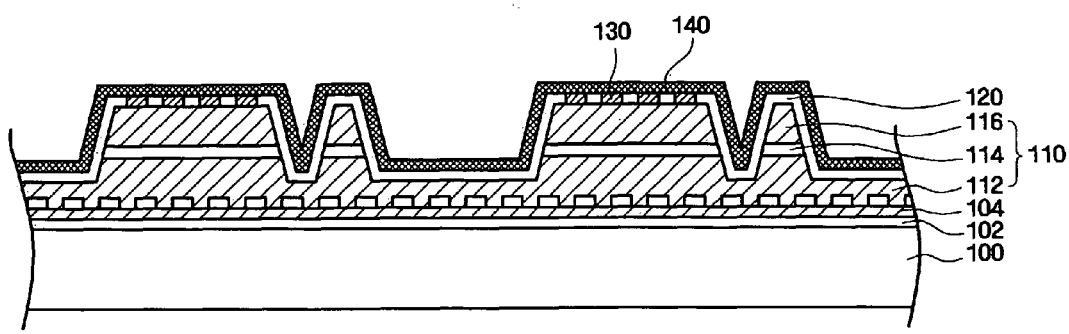

Referring to FIG. 19E, the first ohmic layer 130 may be formed over the second conductive pattern 116. More particularly, the first ohmic layer 130 may fill gap(s) that resulted from the patterning of the first block pattern 120. The first electrode 140 may be formed on the first block pattern 120 and/or the first ohmic layer 130.

Figure 19F:
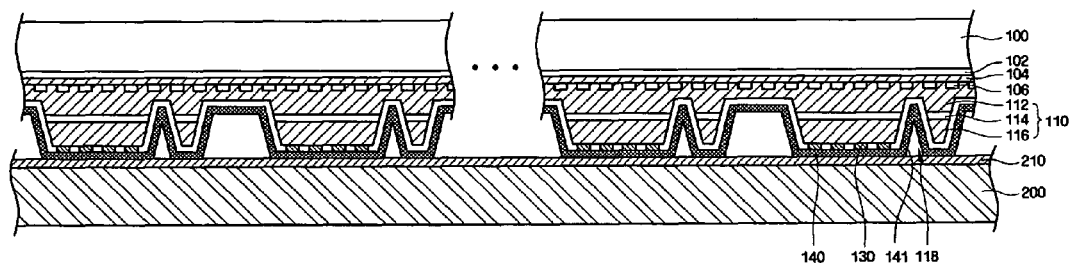
Figure 19G:
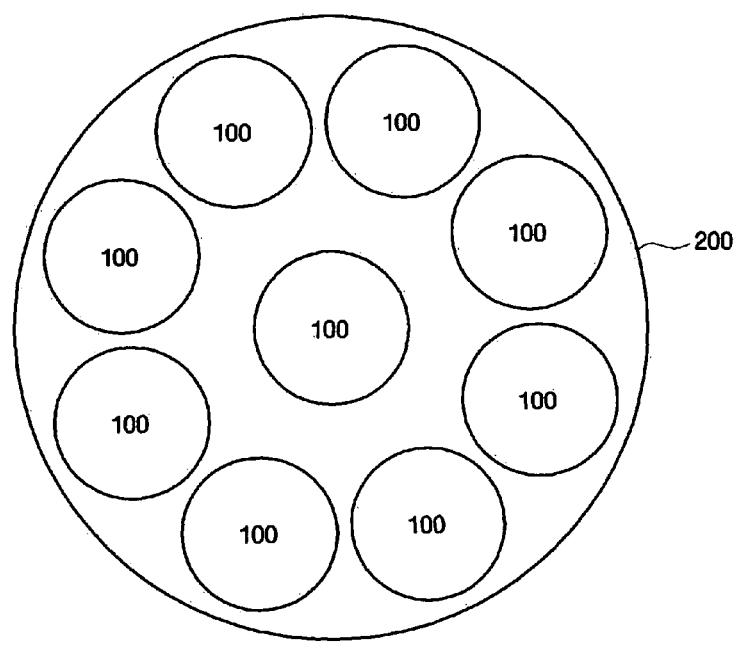

Referring to FIG. 19F, a plurality of the resulting structures of FIG. 19E may be bonded on a conductive substrate 200. For example, as shown in FIG. 19F, the resulting structure of FIG. 19E may be inverted and bonded to the conductive substrate 200. More particularly, a plurality of the resulting structures of FIG. 19E may be bonded on the intermediate layer 210 on the substrate 200, as shown in FIG. 19G. Pluralities of light emitting structures may be formed on a wafer level, i.e., substrates 100, 200 may be wafer-scale substrates.

Figure 19H:
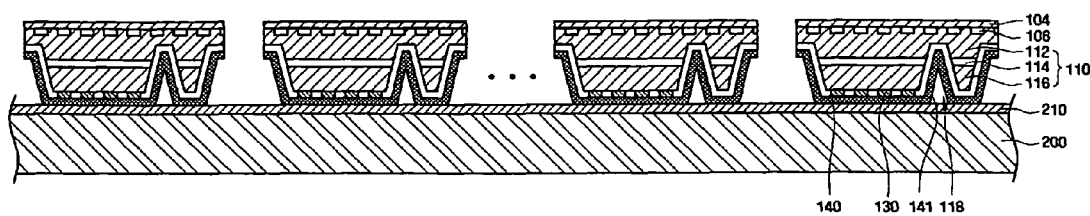
Figure 19I:
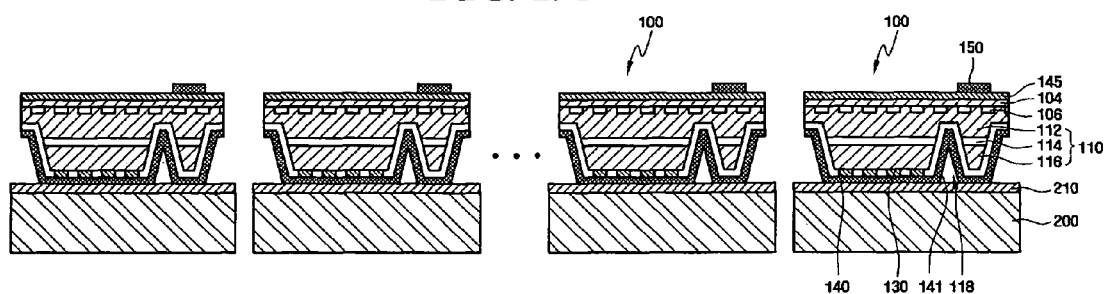

Referring to FIG. 19H, LLO may be used to remove the substrate 100 and the sacrificial layer 102. As shown in FIG. 19H, the buffer layer 104 may be exposed as a result of removing the substrate 100 and the sacrificial layer 102. Referring to FIG. 19I, the second ohmic layer 145 may be formed on the buffer layer 104. The second electrode 150 may be formed on the second ohmic layer 145. Sawing may then be performed to separate the light emitting devices 100 from each other.

Exemplary embodiments of the present invention include been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An emitting device, comprising:
a first electrode;
a second electrode spaced apart from the first electrode;
an emitting pattern including a portion between the first electrode and the second electrode;
a first block pattern including a portion between the emitting pattern and the first electrode and/or on a same level as the first electrode; and
a second block pattern including a portion between the emitting pattern and the second electrode and/or on a same level as the second electrode, wherein the first block pattern and the second block pattern face each other across the emitting pattern.

2. The emitting device as claimed in claim 1, wherein the first electrode includes a first portion extending substantially along a first direction and a second portion extending substantially along a second direction, the first direction crossing the second direction.

3. The emitting device as claimed in claim 1, wherein the first electrode includes two protruding portions defining a cavity and an upper portion of the cavity is wider than a lower portion of the cavity.

4. The emitting device as claimed in claim 1, wherein the first electrode includes a plurality of protrusions defining a light emitting region and a non-light emitting region, and the second electrode overlaps the non-light emitting region of the emitting device.

5. The emitting device as claimed in claim 1, wherein at least one of the first and second block patterns includes an insulating material.

6. The emitting device as claimed in claim 1, wherein at least one of the first and second block patterns includes an oxide layer, a nitride layer, an oxide-nitride layer, an aluminum-oxide layer and/or an aluminum-nitride layer.

7. The emitting device as claimed in claim 1, wherein at least a portion of the first block pattern is directly on the first electrode.

8. The emitting device as claimed in claim 1, wherein the first electrode is substantially flat.

9. The emitting device as claimed in claim 1, wherein the first block pattern and the second block pattern are each one of a line pattern, a mesh pattern and a dot pattern.

10. The emitting device as claimed in claim 1, wherein the first block pattern and the second block pattern are arranged offset relative to each other such that at least a portion of the first block pattern overlaps a space defined by the second block pattern and a portion of the second block pattern overlaps a space defined by the first block pattern.

11. The emitting device as claimed in claim 1, wherein a pattern of the first block pattern is complementary to a pattern of the second block pattern.

12. The emitting device as claimed in claim 1, further comprising a first conductive pattern below the emitting pattern and a second conductive pattern above the emitting pattern.

13. The emitting device as claimed in claim 12, wherein the first conductive pattern, the emitting pattern and/or the second conductive pattern each includes $In_xAl_yGa(1-x-y)N$, where $0 \leq x \leq 1$ and $0 \leq y \leq 1$.

14. The emitting device as claimed in claim 12, wherein the first electrode is arranged such that a portion of the first conductive pattern is at a level higher than a level of the first electrode and another portion of the first conductive pattern is at a level lower than the level of the first electrode.

15. The emitting device as claimed in claim 12, wherein at least one portion of the first electrode is on a same level as a respective portion of the emitting pattern and/or the first block pattern.

16. The emitting device as claimed in claim 12, wherein at least a portion of the second block pattern is aligned with and/or embedded within a portion of the second conductive pattern.

17. The emitting device as claimed in claim 12, wherein at least a portion of the first block pattern is aligned with and/or embedded within a portion of the first conductive pattern.

18. The emitting device as claimed in claim 1, further comprising an ohmic pattern arranged between at least one of the first electrode and the emitting pattern and/or the second electrode and the emitting pattern.

19. The emitting device as claimed in claim 18, wherein the ohmic pattern includes a pattern that is complementary to at least a portion of the first block pattern and is arranged on a same level as the complementary portion of the first block pattern.

20. The emitting device as claimed in claim 18, wherein the ohmic pattern includes a first ohmic pattern between the first electrode and the emitting pattern and a second ohmic pattern between the emitting pattern and the second electrode.

21. The emitting device as claimed in claim 1, wherein the first block pattern includes a protrusion.

22. The emitting device as claimed in claim 1, further comprising a buffer layer between the second electrode and the second block pattern.

23. The emitting device as claimed in claim 22, wherein the buffer layer includes $In_xAl_yG(1-x-y)$ and/or $Si_xC_yN(1-x-y)$, where $0 \leq x \leq 1$ and $0 \leq y \leq 1$.

24. The emitting device as claimed in claim 1, wherein the first electrode includes a reflective material.

25. A light emitting apparatus, comprising:
a light emitting device, including
a first electrode, a second electrode spaced apart from the first electrode,
an emitting pattern including a portion between the first electrode and the second electrode, and
a block pattern including a portion between the emitting pattern and the first electrode and/or on a same level as the first electrode;
a first conductive region on a base substrate electrically connected to the first electrode; and
a second conductive region on the base substrate electrically connected to the second electrode.

26. The light emitting apparatus as claimed in claim 25, wherein the light emitting apparatus is a liquid crystal display back light unit, a projector or a lamp.

27. The light emitting apparatus as claimed in claim 25, wherein the first electrode is electrically connected to the first conductive region through a conductive substrate on which the first electrode is arranged, and the second electrode is electrically connected to the second conductive region with a wire.

28. The light emitting apparatus as claimed in claim 25, wherein the first electrode and the second electrode are electrically connected to the first conductive region and the second conductive region, respectively, with a conductive resin.

29. The light emitting apparatus as claimed in claim 25, wherein the first conductive region and the second conductive region are on a first side of the base substrate, and the light emitting apparatus further comprises:
  a third conductive region on a second side of the base substrate,
  a fourth conductive region on the second side of the base substrate,
  at least one via connecting the first conductive region to the third conductive region, and
  at least one via connecting the second conductive region to the fourth conductive region.

30. The light emitting apparatus as claimed in claim 25, further comprising a phosphor layer on the light emitting device.

31. The light emitting apparatus as claimed in claim 30, wherein the phosphor layer includes a transparent resin, wherein phosphor is dispersed within the transparent resin, on the transparent resin and/or between the transparent resin and the light emitting device.

32. The light emitting apparatus as claimed in claim 25, wherein the light emitting apparatus includes a plurality of the light emitting devices, and the phosphor layer is arranged in a line-type and/or dot-type manner on the light emitting devices.

33. An emitting device, comprising:
  a first electrode on a conductive substrate;
  a second electrode on the first electrode;
  an emitting pattern including a portion between the first electrode and the second electrode; and
  current regulator for regulating current flow through the emitting pattern, wherein at least a portion of the current regulator is arranged along a current path between the first electrode and the emitting pattern such that all current flowing from the first electrode to the emitting pattern passes through at least a portion of the regulator before reaching the emitting pattern.

34. The emitting device as claimed in claim 33, wherein the regulator includes a first regulating pattern arranged between the first electrode and the emitting pattern and/or on a same level as the first electrode.

35. The emitting device as claimed in claim 33, wherein the current regulator includes an insulator.

36. The emitting device as claimed in claim 33, further comprising a conductive pattern on the emitting pattern and a buffer for protecting the current regulator and/or for seeding a conductive pattern on the emitting pattern.

37. The light emitting apparatus as claimed in claim 25, wherein the emitting device further include another block pattern including a portion between the emitting pattern and the second electrode and/or on a same level as the second electrode.

38. The emitting device as claimed in claim 34, wherein the regulator includes a second regulating pattern arranged between the second electrode and the emitting pattern and/or on a same level as the second electrode.

39. The emitting device as claimed in claim 1, wherein the first block pattern exposes the first electrode to the emitting pattern and the second block pattern exposes the second electrode to the emitting pattern.

* * * * *